United States Patent
Schiano

(10) Patent No.: US 7,768,262 B2
(45) Date of Patent: Aug. 3, 2010

(54) CONTINUOUS WAVE NUCLEAR QUADRUPOLE RESONANCE SPECTROMETER

(75) Inventor: Jeffrey L. Schiano, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 47 days.

(21) Appl. No.: 12/142,092

(22) Filed: Jun. 19, 2008

(65) Prior Publication Data

US 2009/0039884 A1 Feb. 12, 2009

Related U.S. Application Data

(60) Provisional application No. 60/944,911, filed on Jun. 19, 2007.

(51) Int. Cl.
*G01V 3/00* (2006.01)

(52) U.S. Cl. ........................................ 324/307; 324/309

(58) Field of Classification Search ......... 324/300–322; 600/410–435
See application file for complete search history.

(56) References Cited

U.S. PATENT DOCUMENTS

| 5,254,950 | A | 10/1993 | Fan et al. |
| 6,100,688 | A | 8/2000 | Smith et al. |
| 6,344,818 | B1 | 2/2002 | Markov et al. |
| 6,392,408 | B1 | 5/2002 | Barrall et al. |
| 6,856,133 | B1 * | 2/2005 | Beliakov et al. ............. 324/307 |
| 7,511,500 | B2 * | 3/2009 | Schiano et al. ............... 324/318 |
| 2005/0122109 | A1 | 6/2005 | Wilker et al. |
| 2006/0012371 | A1 | 1/2006 | Laubacher et al. |

FOREIGN PATENT DOCUMENTS

JP  5133911  9/1982

OTHER PUBLICATIONS

Latosinska, Jolanta N., Applications of nuclear quadrupole resonance spectroscopy in drug development, Expert Opin. Drug Discov. (2007) 2(2):225-248.

* cited by examiner

*Primary Examiner*—Brij B Shrivastav
*Assistant Examiner*—Dixomara Vargas
(74) *Attorney, Agent, or Firm*—Gifford, Krass, Sprinkle, Anderson & Citkowski, P.C.; Douglas L. Wathen

(57) ABSTRACT

Apparatus and methods for locating a nuclear quadrupole resonance are described. In an example method, a search frequency is adjusted using a blind search until a resonance absorption of an analyte is detected, and then an extremum seeking search to be used to locate an extremum frequency.

13 Claims, 16 Drawing Sheets

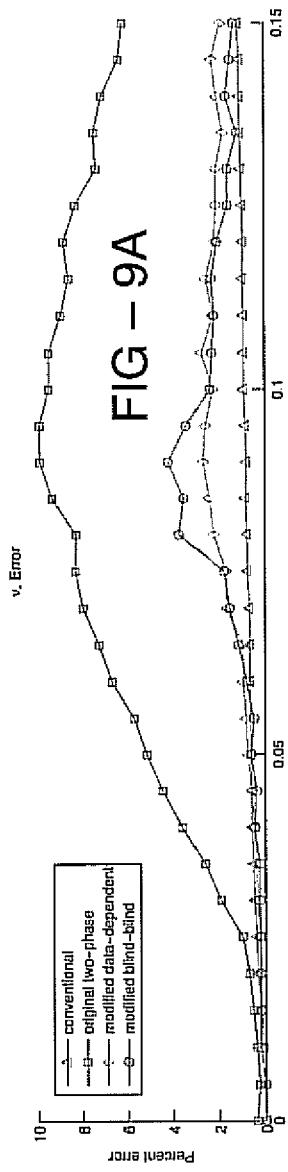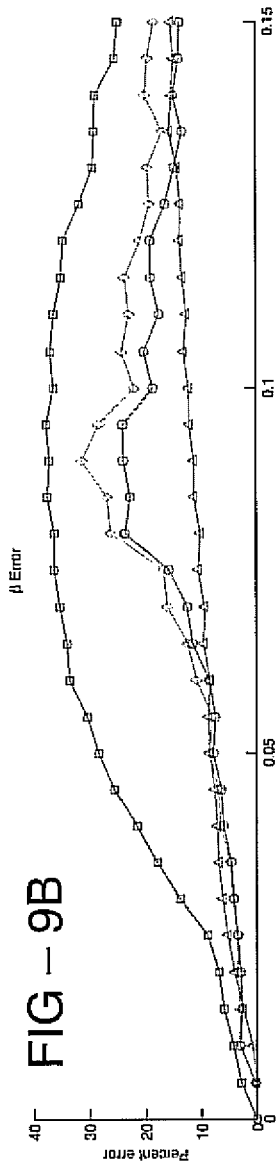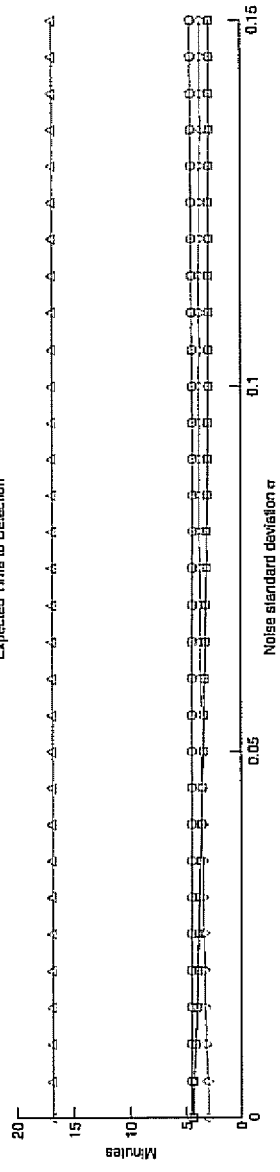

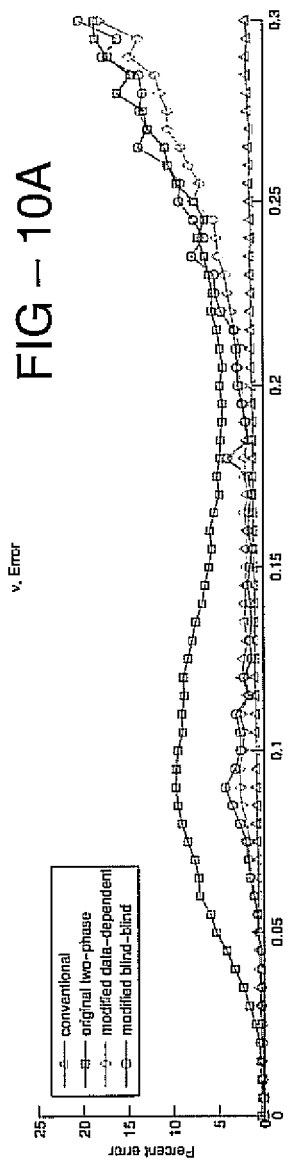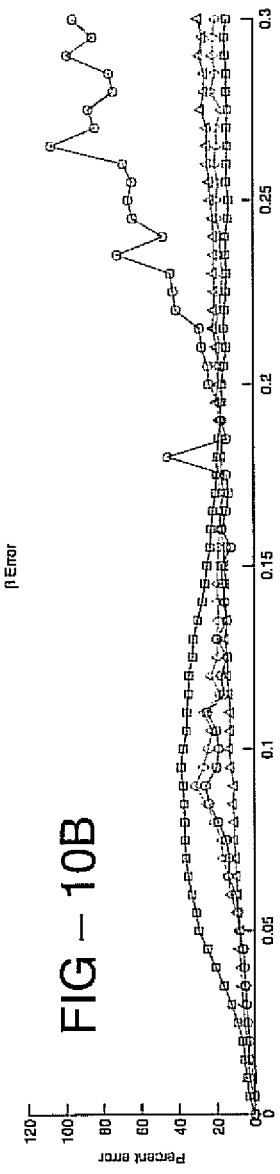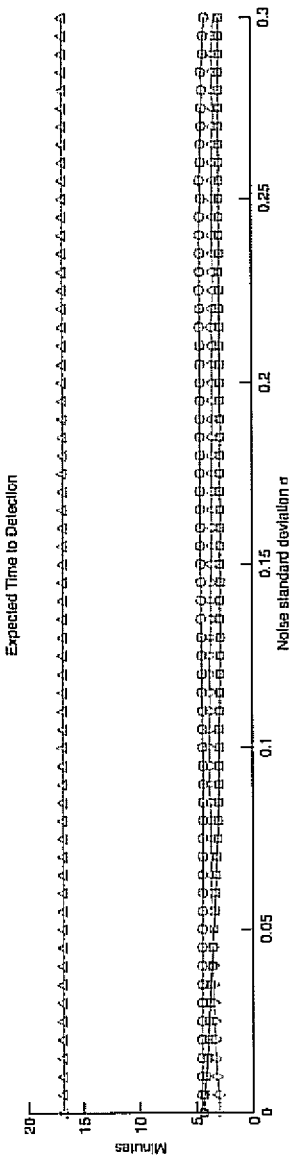
FIG – 10A
FIG – 10B
FIG – 10C

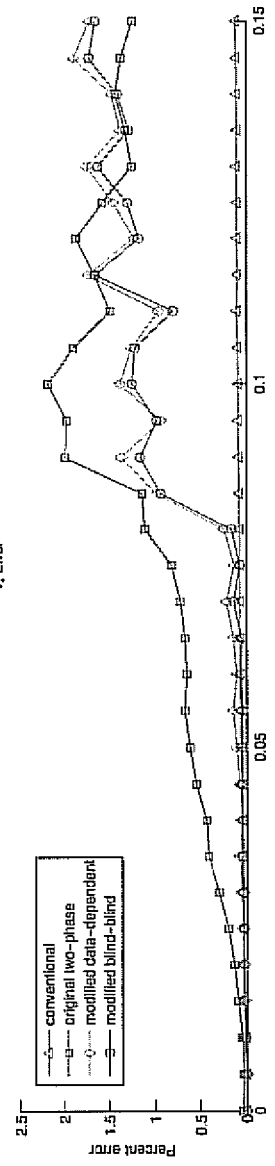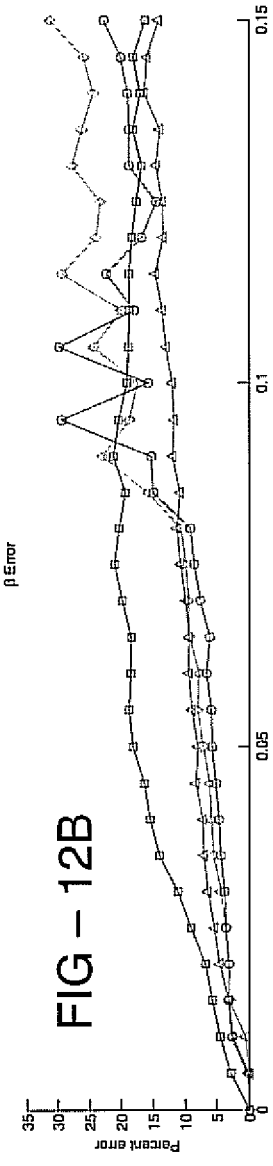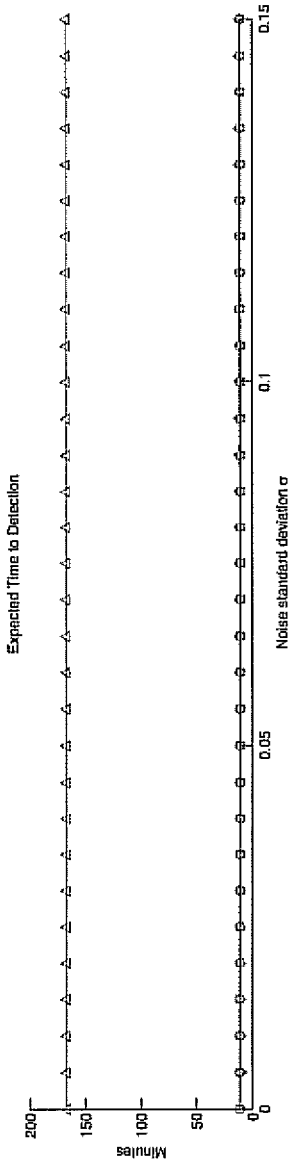
FIG – 12B
FIG – 12B
FIG – 12C

CONTINUOUS WAVE NUCLEAR QUADRUPOLE RESONANCE SPECTROMETER

REFERENCE TO RELATED APPLICATION

This application claims priority from U.S. Provisional Patent Application Ser. No. 60/944,911, filed Jun. 19, 2007, the entire content of which is incorporated herein by reference.

FIELD OF THE INVENTION

The present invention relates to apparatus and methods related to signal detection, for example nuclear quadrupole resonance (NQR) spectroscopy, including continuous wave (CW) NQR spectroscopy.

BACKGROUND OF THE INVENTION

The nuclear quadrupole moment is a measure of the deviation of the nuclear charge distribution from spherical symmetry. There is a quantized electrostatic interaction energy between the nuclear quadrupole moment and the electric field gradient tensor resulting from the surrounding electronic charge. This leads to preferred orientations of the nucleus with quantized energy levels.

A quadrupolar nucleus has a magnetic moment that is related to the intrinsic angular momentum, or spin, of the nucleus. The magnetic moment of the nucleus is also quantized, and for nitrogen-14 it can take on three values.

The orientation of the nucleus can be perturbed by applying an oscillating magnetic field whose frequency corresponds to the energy difference between any two preferred nuclear orientations. The energy difference, and associated transition frequency, between any two levels is not necessarily sharp. Impurities, mechanical strains, and temperature gradients in a material all lead to a distribution of resonant frequencies, or lineshape.

In conventional NQR detectors, excitation of a QR response requires the application of a pulsed RF magnetic field within the search volume. The applied RF pulse may excite spurious responses from materials within the search volume that can obscure the QR response, leading to an unacceptably large false alarm rate. Examples of internal noise sources include the decaying magnetic field generated by currents induced within conductive materials located within the search volume, as well as piezoelectric responses from materials within the search volume. In order to excite a QR response, the amplitude of the RF field is typically larger than several Gauss over the search region. This level of amplitude requires the use of a costly power amplifier and excitation probe, and exceeds the allowable limits for human exposure.

SUMMARY OF THE INVENTION

Examples of the present invention include continuous wave (CW) nuclear quadrupole resonance (NQR) spectrometers, and methods of frequency adjustment to facilitate resonance signal detection. A CW detection systems excites a QR response by applying a steady-state RF magnetic field whose amplitude can be orders of magnitude smaller than that of pulse excitation systems.

Conventionally, the excitation field frequency is swept in a linear fashion over a spectral region of interest, and conventional CW detection systems achieve a useful SNR only at the expense of impractically large detection time for security or other applications. Embodiments of the present invention allow more rapid detection of resonance signals.

The detection time for a CW QR spectrometer is determined by the number of frequency search points used to locate and characterize a QR transition. Examples of the present invention include novel frequency search algorithms that allow reduction of the number of search points. Frequency search algorithms include blind search algorithms, and in this context, the term blind search algorithm refers to a search algorithm for which the choice of frequencies is not influenced by collected data. Frequency search algorithms may also be data-dependent, in which collected data is used to guide the following choice of frequency step. A data-dependent search algorithm may start with one or more arbitrary frequencies steps if insufficient data has been collected to guide the choice of frequency steps.

Examples of the present invention include a combination of blind and data-dependent algorithms two-stage search strategy that allows further reduce the detection time. The blind search algorithm may be a discontinuous search. For example, a blind search algorithm may have a start frequency corresponding to an expected transition frequency, and then have frequency steps of increasing magnitude and alternating signs (i.e. to higher or lower frequencies). An example blind search algorithm is a spiral algorithm.

An example spiral search algorithm may start at an expected transition frequency and then moves outward. The frequencies chosen correspond to the intersection of a spiral centered on the start frequency with the frequency axis. A blind spiral search reduces the expected time to detection as it typically uses less frequency search points than a linear sweep. An expected transition frequency may be determined for a known analyte, or by chemical analog analysis, or other approach. An expected transition frequency may also include the effects of temperature, strain, chemical environment, or other factors. For example, the temperature of an analyte may be measured using a temperature sensor (such as an IR sensor), and the temperature used to estimate a resonance frequency.

Search algorithms also include data-dependent search algorithms. Improved data-dependent search algorithms were developed that use an extremum seeking adaptive control algorithm to locate the peak(s) of an absorption signal. In some examples, these peaks can be used to calculate the location and width of a transition, and it is not necessary to uniformly sample the entire lineshape for characterization as is done conventionally.

An example method of characterizing a nuclear quadrupole resonance for an analyte within a sample volume using continuous wave (CW) spectroscopy comprises applying an excitation magnetic field to the sample volume, the excitation magnetic field having a search frequency, and adjusting the search frequency using a blind search algorithm so as to detect a resonance absorption signal. The blind search has a start frequency that can be the expected or most likely frequency to detect a resonance, and the end frequency may be that at which a resonance signal is detected, but not necessarily an extremum in the resonance signal. The search frequency can then be adjusted using an extremum seeking algorithm so as to determine an extremum in the resonance absorption signal. The frequencies in a blind search may alternate between frequencies higher than the start frequency and frequencies lower than the start frequency, so that the search is non-linear and non-contiguous. Frequency steps in a blind search may successively change sign and increase in magnitude with each iteration (change in frequency), so that the search moves outwards from the start frequency and both higher and lower frequencies are explored, relative to the start frequency. The blind search may be a spiral search centered at the start frequency.

In some examples, an extremum-seeking search is a data dependent search, in which the search frequencies are selected at least in part using obtained magnitudes and signs of a resonance absorption signals. The frequency step between each frequency may be selected using changes in magnitude and/or sign of a detected absorption signal. If the search frequency appears to have moved through an extremum, the frequency step may be reduced and the direction of a search reversed (e.g. from increasing to decreasing frequencies).

An excitation magnetic field can be applied to a search volume using a marginal oscillator, so that the search frequency is the oscillation frequency of the marginal oscillator.

An example continuous wave nuclear quadrupole resonance (NQR) spectrometer. the spectrometer comprises a probe coil (such as a conventional (non-superconducting coil or superconducting resonator) an oscillator (such as a marginal oscillator), and an oscillation frequency controller. The oscillation frequency controller may include variable capacitive elements, or other variable reactive elements, and an electronic circuit configured so as to control the oscillation frequency using one or more search algorithms such as described herein.

An example two-stage search strategy combines a blind spiral search with a data-dependent algorithm to locate and characterize a QR transition. Example search strategies can be more rapid than conventional approaches. In a representative example, a first stage uses a blind spiral search, which may be centered on an expected transition frequency determined from chemical analog information. A blind search may be a discontinuous algorithm, such as a nonlinear algorithm. A second stage uses a data-dependent search to locate an extremum of the absorption signal. This may be used to characterize the transition without collecting data over the entire lineshape. A single algorithm may be used to implement the first and second stages.

In some detection schemes, particularly those using a lock-in amplifier, the absorption signal relates to the derivative of the lineshape, and for a single peak includes maximum and minimum extrema. The frequency difference between the extrema may be used to characterize the lineshape, and the average of the two frequencies may be used as the resonance frequency.

When compared with the conventional linear sweep of a CW QR spectrometer, novel algorithms described herein allow a large reduction in the expected time to detection. For a typical transition linewidth, in simulations the search algorithms improved the detection time by an order of magnitude. A tradeoff for this speed improvement is a possible increase in the estimation error for the transition frequency location and the linewidth when there is measurement noise.

In some examples, a two-stage search strategy was designed for low noise applications. An example gradient algorithm used to converge on the extrema uses a sign-sign algorithm to allow for some noise tolerance.

For almost any value of measurement noise, the expected time to detection of the unmodified two-stage search strategy is lower than that of the other search algorithms. At low noise values, the two modified algorithms have less estimation error than the original two-stage search strategy because they have been designed to function in the presence of measurement noise. However, at higher noise values, various algorithms have comparable errors. For transitions with larger linewidths, the modified data-dependent algorithm is faster than the modified blind-blind algorithm.

For smaller linewidths, the expected times to detection of the two modified algorithms are approximately the same. However, the advantage of the modified blind-blind search is that it uses a simple algorithm, making it easier to understand and implement.

BRIEF DESCRIPTION OF THE DRAWINGS

FIGS. 9A-9C shows the performance comparison for low noise values when the absorption curve has a peak separation;

FIGS. 10A-10C shows performance metrics over a larger range of standard deviation values;

FIGS. 12A-12C show frequency error, expected time to detection, and noise standard deviation for different algorithms;

DETAILED DESCRIPTION OF THE INVENTION

Figure 1A:
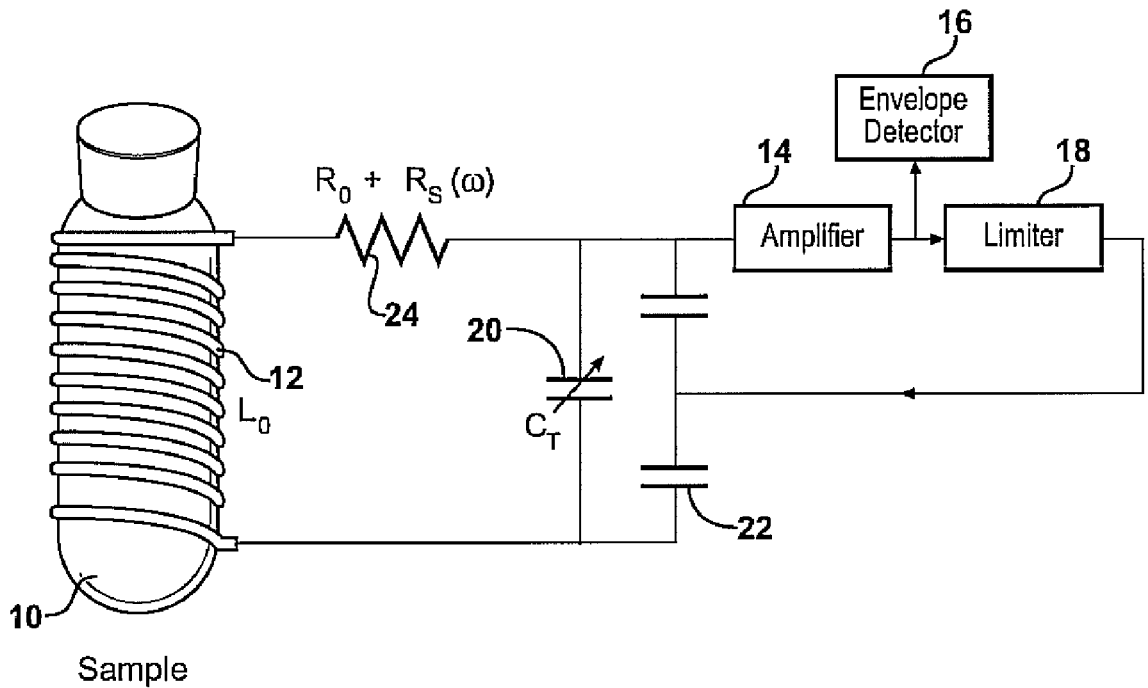
FIG. 1A is a schematic of a continuous wave spectrometer.

Embodiments of the present invention include apparatus and algorithms which allow reduction of the time required to detect and characterize quadrupole resonance (QR) transitions using continuous-wave (CW) spectroscopy. The time required to search for, verify the presence of, and quantify the properties of a QR transition can be reduced, compared to existing techniques, by providing an approach for systematically varying the amplitude and frequency of the CW excitation signal over orders of magnitude while simultaneously reducing the number search steps in which the frequency and amplitude of the detection system are varied.

Novel search algorithms were developed to improve the detection time of CW QR spectroscopy. The expected time to detection for a blind search can be improved by using a nonlinear search, such as a spiral search. A data-dependent search can be used to characterize the transition frequency and full-width at half-maximum using less search points than a blind search. Two exemplary modified data-dependent algorithms were developed that showed improved tolerance to measurement noise.

In some examples, a two-stage search strategy is used to detect and characterize a transition, with a reduced number of search points needed compared to conventional approaches.

In a representative example, the first stage of a search strategy uses a blind algorithm to detect the presence of a QR transition. A second stage uses a data-dependent search algorithm to characterize the transition. In a blind search, the choice of search frequency is not dependent on the acquired measurements. Using a nonlinear search for the first stage of the two-stage search strategy can improve the expected time to detection by reducing the number of search points required to find a QR transition. The nonlinear search that is used in this example is a spiral search that iteratively searches outward from the position of the expected transition location, for example as determined by chemical analog analysis. The spiral search runs until a change is detected in the absorption signal, which signals the presence of a QR transition. The second stage of the two-stage search strategy is a data-dependent algorithm, in some examples using measurements from the lock-in amplifier to steer the search in a certain direction. This stage uses an extremum seeking algorithm to locate the extremum frequencies of the absorption signal, which are then used to calculate the transition location and width to characterize the QR transition. The two-stage search strategy significantly decreases the expected time to detection of a CW QR spectroscopy experiment.

In other examples, algorithms may be adapted for use with other detection schemes, such as 2f lock-in detection, and detection schemes that do not use a lock-in amplifier.

Further, modified search algorithms were developed to detect and characterize QR transitions in the presence of typical measurement noise. MAILAB (MathWorks, Natick, Mass.) simulations were used to compare the performance of the novel search algorithms with a conventional linear sweep. The metrics for comparison in these simulations were the expected time to detection and the amount of error in the estimations of the transition location and width, and significant improvements in these metrics were observed.

Algorithms described herein may also be used for pulsed NQR detection, and with NQR spectrometers with HTS coils. Examples of the present invention include pulsed NQR spectrometry, as well as CW NQR spectrometry. The tuning frequency of a narrow-band HTS probe may be adjusted using algorithms according to embodiments of the present invention. For example, pulsed excitation can be used for wideband excitation of a sample, and the tuning frequency of a high-Q detector coil (such as an HTS coil) adjusted using methods according to embodiments of the present invention. Hence, the excitation may not be tuned, or have coarse tuning only, with fine tuning of the detected signal achieved by tuning the detector coil. This may be achieved by switching capacitors or other components (C, L, and/or R) into a resonant circuit of the detector coil, or a tuning coil coupled to the detector coil. Lock-in detection of the detected signal may be used, or in other examples, not used.

NQR Spectrometer

FIG. 1A shows a block diagram of an example CW NQR spectrometer, using a Robinson marginal oscillator (RMO). The spectrometer comprises a probe coil 12 proximate an analyte sample 10, amplifier 14, envelope detector 16, limiter 18, tuning capacitor 20, capacitance current divider 22, and resistive element 24.

The frequency of the RF magnetic field generated by the probe coil is set by the tuning capacitance $C_T$. As the frequency of the RMO is swept through a QR transition by varying $C_T$, absorption of energy by the nuclei increases the sample resistance $R_s(W)$. The increased value of the sample resistance reduces the amplitude of oscillation, which is observed by monitoring the output of an envelope detector.

The tuning capacitor may comprise a variable capacitor (varactor), for example an electrically tunable capacitor, and may comprise a switch-selectable bank of capacitors for discontinuous frequency selection.

The frequency of the excitation current in the probe coil is determined by the tuned circuit formed by the probe coil connected in parallel with the adjustable capacitance CT. The impedance looking into the tuned circuit is maximized at the resonance frequency of the tuned probe coil, $$\omega_o = \sqrt{\frac{1}{L_0 C_T}} \quad (1)$$

At frequencies either above or below the resonance frequency, the magnitude of the impedance of the tuned circuit falls to zero, quenching the oscillation. For a given excitation current in the probe coil, the voltage across the tuned circuit is proportional to the Q-factor of the probe coil, and as the resonance frequency approaches a QR transition, the value of $R_s(\omega)$ increases, decreasing both the Q-factor and the voltage across the probe coil.

The amplifier 14 helps detect a change in the amplitude of the voltage across the probe circuit without reducing the Q-factor. A high Q-factor is generally desirable because the signal-to-noise ratio of the envelope detector output is proportional to the square root of the Q-factor. By choosing an amplifier with a high input impedance, the Q-factor of the tuned probe is not significantly reduced because the probe circuit is not loaded by the input impedance of the amplifier. The amplifier is also provides voltage gain so that the loop gain does not fall below one, which would cause the tuned circuit to stop oscillating. The amplifier may have an adjustable gain, the gain being adjustable to maintain a loop gain of at least one.

The output of the amplifier 14 is passed through a limiter 18 and then coupled back to the tuned circuit through a capacitive current divider 22 to form an oscillator. The purpose of the limiter is to saturate the feedback signal to a constant amplitude so that the amplitude of the oscillation is directly proportional to the Q-factor of the tuned probe coil. As a result, as the probe frequency approaches the QR transition frequency, the nuclei absorb power and the resulting decrease in the probe Q-factor reduces the amplitude of oscillation.

In a Robinson marginal oscillator configuration, the amplifier and limiter are implemented as separate components. The level of the oscillation amplitude is sensed by an envelope detector, and the envelope detector provides an output signal. The envelope detector may comprise either a rectifier implemented with a diode or use a signal product approach using an analog multiplier.

The resistive element shown at 24 does not represent a discrete component, but may be used to electrically represent the effects of coil resistance (if not superconducting), coil contact or lead resistances, other resistance, or effect of sample absorption on the electrical properties of the probe coil.

The probe coil 12 may include a high-temperature superconductor coil, for example a material operable as a superconducting resonator at a temperature above 77K.

The resonance frequency may be electronically controlled for example using a switched bank of capacitors, electronically tunable capacitor, electronic control of plate overlap in a mechanically variable capacitor, or any other control method.

Figure 1B:
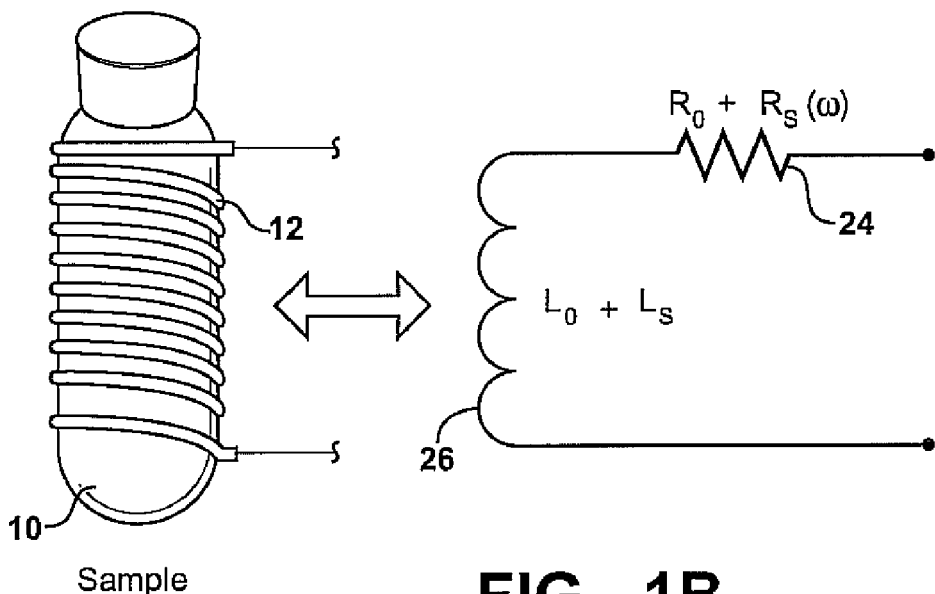
FIG. 1B illustrates an equivalent circuit for the resonator.

FIG. 1B illustrates an impedance model for a probe coil 12 proximate a sample 10, in terms of the inductive component 26 and the resistive element 24. The Q-factor is given by:

$$Q = \frac{\omega(L_0 + L_s(\omega))}{R_0 + R_s(\omega)} \quad (2)$$

$$R_s(\omega) \propto \Lambda(f) \quad (3)$$

and $$L_s(\omega) \propto (v_* - f)\Lambda(f) \quad (4)$$

where, in the case of a Lorentzian lineshape, $$\Lambda(f) = \frac{2T_2^*}{1 + [2\pi T_2^*(f - v_*)]^2} \quad (5)$$

Figure 1C:
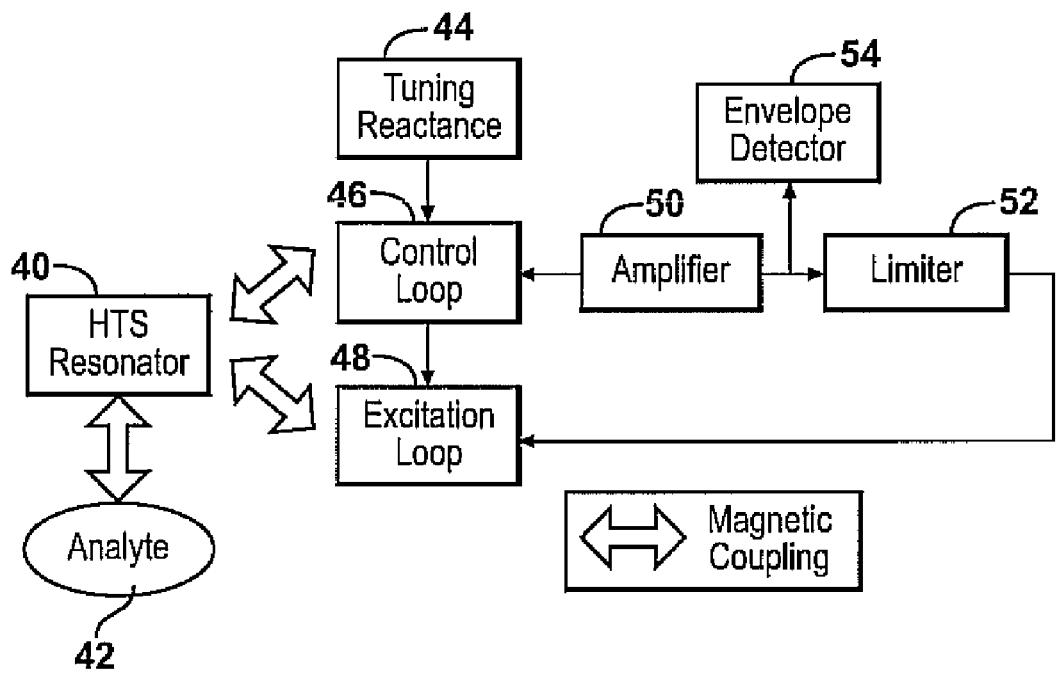
FIG. 1C illustrates a further spectrometer configuration using magnetic coupling to a resonator.

FIG. 1C is a schematic of a spectrometer circuit using a high temperature superconductor (HTS) probe. The spectrometer circuit comprises an HTS resonator 40 proximate analyte 43, tuning reactance 44, control loop 46, excitation loop 48, amplifier 50, limiter 52, and envelope detector 54. Operation of this circuit is similar to that described above in relation to FIG. 1A.

In this case, a control loop is used to tune the circuit. The control loop is magnetically coupled to the resonator 40. A variable tuning reactance modifies the resonant frequency of the control loop/tuning reactance resonant circuit. The control loop is magnetically coupled to the probe coil (such as an HTS resonator), and the magnetic coupling allows the oscillation frequency of the resonant circuit including the probe coil to be adjusted by tuning the resonant circuit including the control loop.

The excitation loop 48 is used to couple to the probe coil (e.g. HTS resonator) 40 using magnetic coupling, and this avoids the need for a direct electrical connection to the superconducting material of the resonator.

Lock-In Detection

The amplitude of the voltage across the probe coil in a Robinson marginal oscillator may typically be on the order of a volt. The change in the amplitude due to power absorption by quadrupolar nuclei may typically be on the order of 1 μV.

Figure 2A:
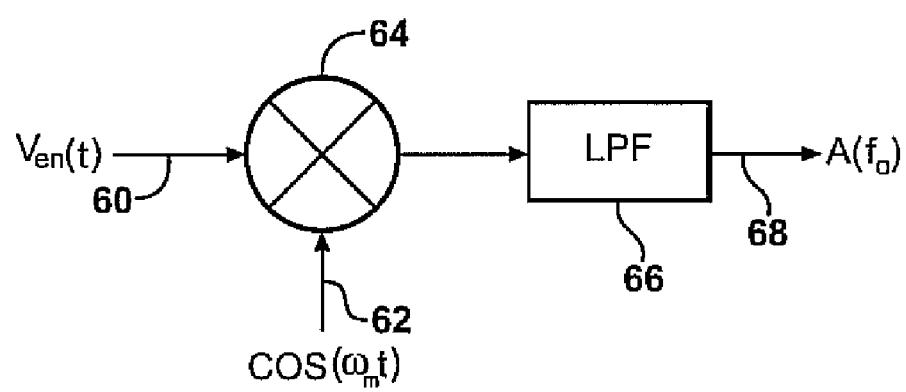
FIGS. 2A-2C illustrates lock-in detection, FIG. 2B showing a typical absorption signal obtained using lock-in detection.
Figure 2B:
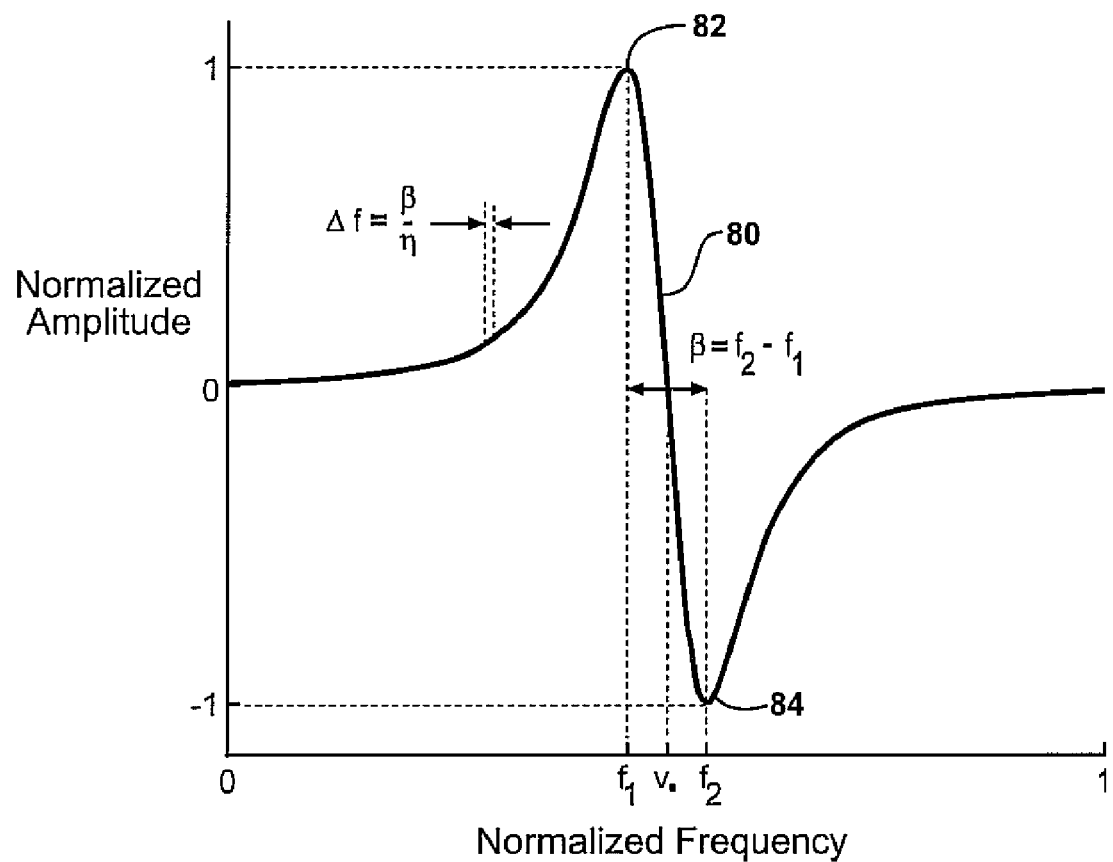
Figure 2C:
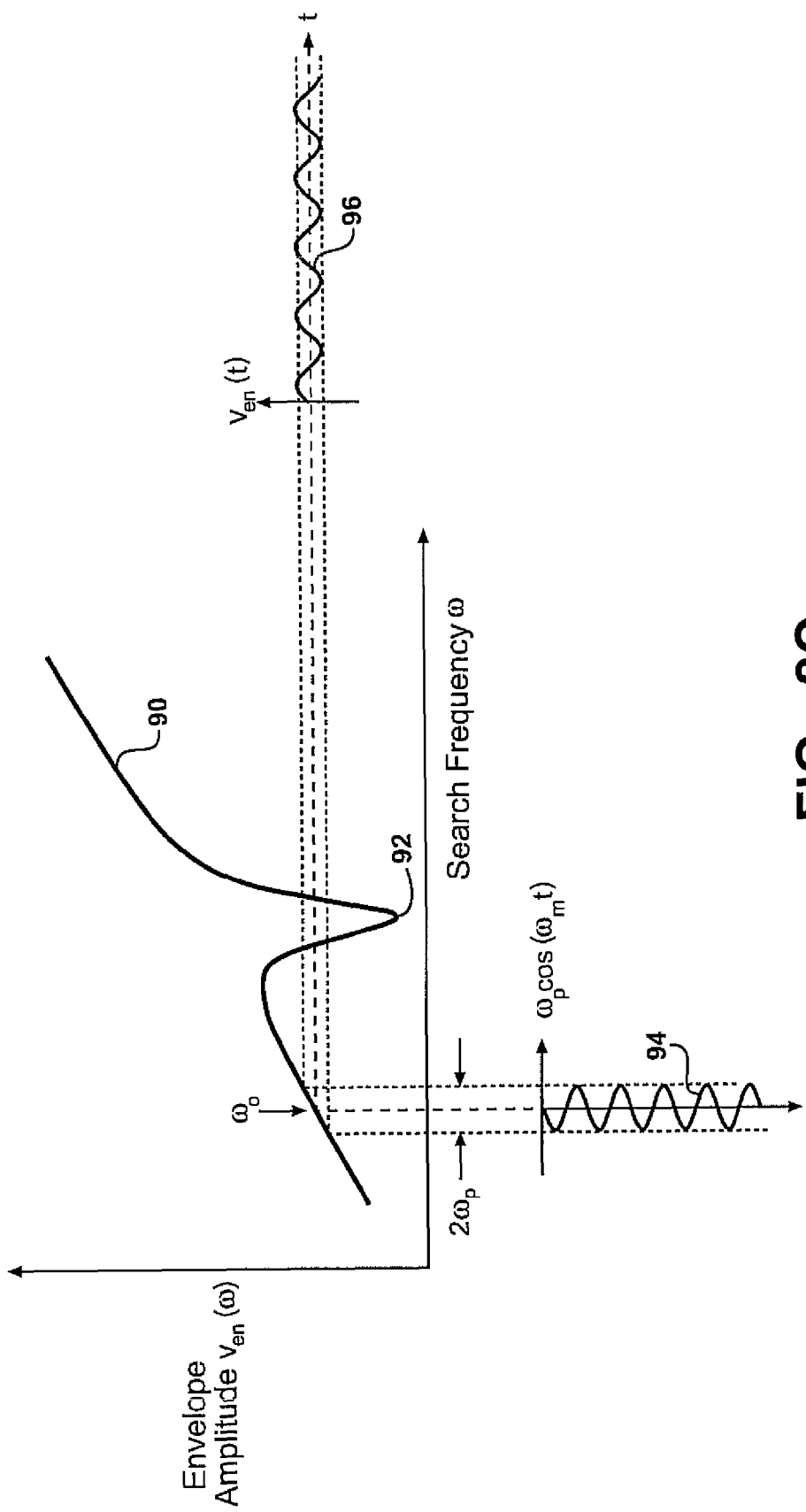

FIGS. 2A-2C illustrates operation of an optional lock-in detector which may be used in spectrometer circuits to improve the SNR of the measurement of the absorption signal by significantly decreasing the noise bandwidth at the expense of increasing detection time. FIG. 2A shows a block diagram of a lock-in amplifier useful for phase sensitive detection, with the input signal 60 and modulation (reference) signal 22 are multiplied by multiplier 64, and the produced signal passed through an low pass filter (LPF) 66 to output at 68. The output of the lock-in amplifier is typically proportional to the derivative of a Lorentzian lineshape, so that two extrema are observed in an absorption signal from the lock-in amplifier.

FIG. 2B shows a simulated absorption spectrum 80, normalized so that the frequency range is 0-1 and absorption is in the range −1 to 1. The signal is a differential signal having first and second extrema at 82 and 84 respectively. The frequency difference between the extrema is $\beta=f_2-f_1$, and the full width at half maximum (FWHM) is $\sqrt{3}\beta$.

FIG. 2C illustrates operation of the lock-in detection, which is described further below. The envelope detector output amplitude is shown as a function of frequency ω without modulation as curve 90. The modulating signal is shown at 94, and the modulated output is shown at 96.

In order to detect a small change in envelope amplitude using lock-in detection, the frequency of the oscillator is modulated about its operating frequency, so that the instantaneous frequency is $$\omega(t)=\omega_o+\omega_p\cos(\omega_m t)=\omega_o+\Delta\omega \quad (6)$$

where $\omega_p$ is the maximum perturbation frequency of the oscillator and $\omega_m$ is the modulation frequency, generally much smaller than the operating frequency $\omega_0$.

For a Lorentzian peak, the envelope amplitude has the form $$v_{en}(\omega) = \overline{K}\frac{\omega_o(L_0 + L_s(\omega_o))}{R_0 + R_s(\omega_o)} \quad (7)$$

which may be shown to be $$v_{en}(\omega) = \overline{K}Q_0 + \overline{K}\frac{L_0}{R_0}\Delta\omega - K\overline{K}\frac{Q_0}{R_0}\frac{d\Lambda(\omega)}{d\omega}\bigg|_{\omega=\omega_o}\Delta\omega \quad (8)$$

As a function of the oscillator operating frequency, the envelope amplitude is the derivative of the Lorentzian lineshape plus a linear term due to the increase of the probe Q-factor with frequency. The value of $KQ_0$ is typically 1 V and the derivative term is typically several orders of magnitude smaller. For this reason, the variation in the amplitude of the derivative of the Lorentzian lineshape may be measured using lock-in detection.

The SNR of an absorption signal measurement is also influenced by the excitation field strength. The power absorbed by the nuclei is proportional to the strength of the excitation field up to a certain level where the excitation field is strong enough to significantly change the probabilities of occupation in the excited energy levels. Beyond this field strength, the absorbed power decreases. For detection of known analytes, the excitation strength can be adjusted for that material. For example, the absorption signal amplitude of hexamethylenetriamine (HMT) is maximized for an excitation power of approximately 20 mG, which can be used for CW NQR. In contrast, pulsed excitation generally requires much greater excitation powers, requiring more expensive support electronics, decreasing signal strength, and also generating an electromagnetic hazard.

In some examples, a lock-in detector need not be used. In particular, using a high-Q HTS resonator, for example a resonator having Q>10,000, in some cases an acceptable signal to noise ratio can be obtained without lock-in detection. excitation field strength.

The excitation power absorbed by quadrupolar nuclei is proportional to the strength of the excitation field, but only up to an excitation field strong enough to significantly change the probabilities of occupation in the excited energy levels. The absorbed power decreases beyond this field strength. Hence, the peak-to-peak amplitude of the lock-in amplifier is a function of the excitation field strength. For example, for CW-NQR spectroscopy of hexamethylenetetramine (HMT) the optimal field strength is approximately 21 mG (compared with several gauss required for typical pulsed experiments). The absorption and so the SNR of a CW experiment sensitive to the amplitude of the excitation field, and an optimized field strength can be determined experimentally and used for operation of an instrument. In some examples, the optimized field strength can be estimated from a linewidth parameter, and may be automatically adjusted using a computer.

Excitation amplitude and frequency can both be varied within a detection approach. Amplitude can be varied to maximize the signal to noise ratio of the absorption signal.

Frequency Search Algorithms

A CW spectrometer may be used to search for an unknown transition over a broad frequency range, an unknown transition over a reduced frequency range using known transitions from chemical analogs to predict the transition frequency, or to measure variations in a known transition as a function of material state. For an unknown nitrogen compound, a transitions frequency for nitrogen-14 nuclei may be in the range 500 kHz to 5 MHz. An estimate of the transition frequency may be determined from chemical analogs allowing the search region can be reduced to a much smaller range, typically ±100 kHz from the estimated value. For a known transition, the search region may be narrowed to ±50 kHz from the expected location of the transition.

The time to detection $T_D$ is determined by the number of search points N required to detect the transition, and the dwell time D required to obtain a measurement at a given search frequency, i.e. $T_D$=N.D. Depending on the strategy for selecting frequency search points, N may be either a constant or a function of the measured absorption signal. In the latter case, TD is the expected time to detection, reflecting the uncertainty in N due to the unknown location of the transition. The dwell time D sets the SNR of the CW measurement, which is proportional to the square root of the dwell time. The dwell time is greater if a lock-in system is used.

Embodiments of the present invention include a two-stage search strategy for reducing the expected time to detection. In examples, the search frequencies are not contiguous, and the operational frequency is not monotonically changing. The absorption signal may be used to guide the search. The entire lineshape need not be swept in order to estimate the values of the transition frequency and the inverse-linewidth parameter T2*.

For a blind linear search, the time to detection is the product of the number of search points and the dwell time, and the number of points is approximately equal to the frequency range covered divided by the frequency step used: N=(range/step)+1).

An example two-stage search strategy is described that allows reduction of the expected time to detection. The spectrometer frequency may be electronically tunable, for example using varactors and/or a bank of switch-selectable capacitors, and a computer system used that uses previous and/or current measurements of the absorption signal strength to set one or more future search frequencies.

The first stage determines the general location of the transition. Once a change in absorption is detected, the search enters a second stage which locates the peaks (extrema) of the absorption signal, illustrated in FIG. 2B as frequencies $f_1$ and $f_2$. These peak locations can then used to determine the location and width of the QR transition. For example, the QR transition frequency may be determined as the arithmetic mean of the two frequencies, and the difference in extrema frequencies can be used as a measure of the transition width.

The first stage may be implemented as a blind spiral search that iteratively searches outward from the expected transition location. A spiral search is may be a blind algorithm using a set of predefined frequencies. At each of these frequencies, the amplitude of the absorption signal is measured. This stage of the search strategy terminates if the magnitude of the measured absorption signal exceeds a threshold value. An absorption signal may be identified as a QR transition when the measured amplitude surpasses the noise floor.

The second stage comprises an extremum seeking adaptive control algorithm. This algorithm is data-dependent because it uses information about the current absorption level to determine the frequency of the next search point. The two-stage search strategy completes when both peaks of the signal have been located. The transition frequency located at the arithmetic mean of the peak locations (for a derivative signal), and the inverse-linewidth parameter $T_2$* is related to the distance between the peaks.

The determined inverse-linewidth parameter can further be used to modify the amplitude of oscillation.

Spiral Search

Figure 3:
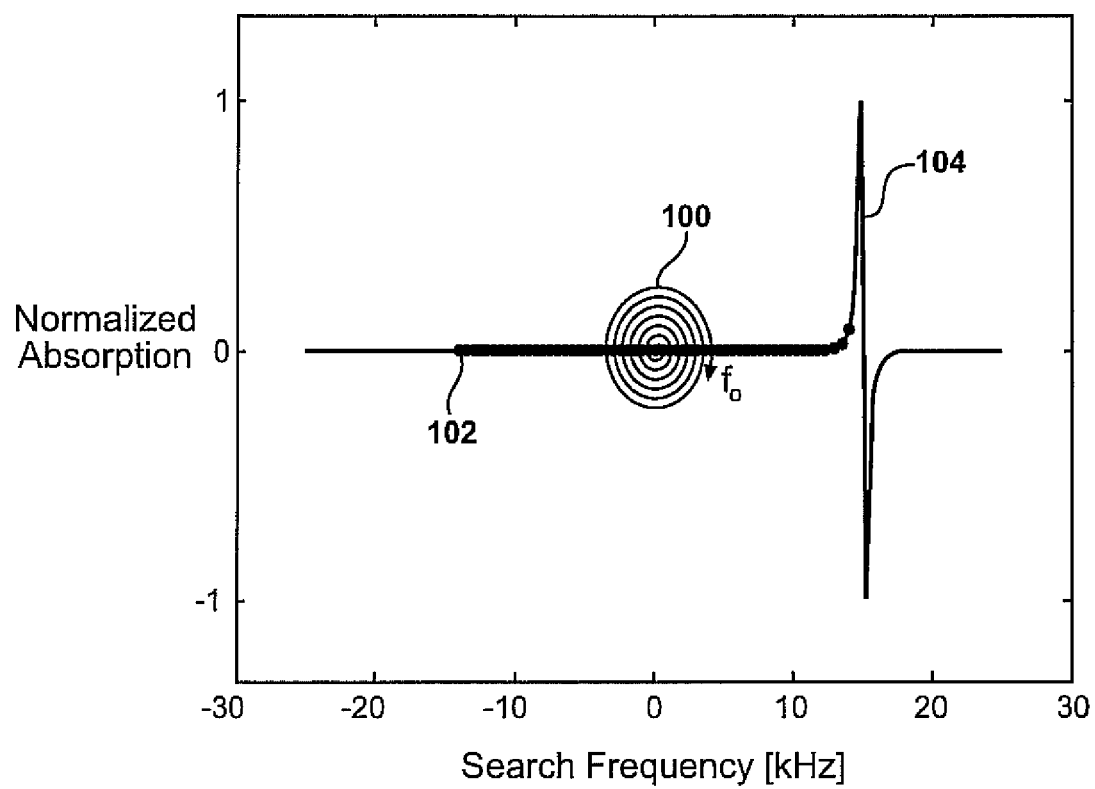
FIG. 3 illustrates frequency selection using a spiral search algorithm.

FIG. 3 illustrates a spiral search algorithm. This example is a blind search algorithm, as collected data does not influence the frequencies selected (but may be used to end the search). The spiral search begins at a start frequency, which may be the expected transition frequency of an analyte, and searches outwards from the start frequency in a "spiral" pattern as illustrated in FIG. 3. This is an example of a discontinuous or non-linear search, as the selected frequencies alternate between frequencies above the start frequency and frequencies below the start frequency.

The expected transition frequency can be determined from chemical analogs with known transition frequencies. The search range is typically centered at the expected transition location.

In a spiral search, the step size to the next frequency search point may vary with the iteration index k. The spiral search may use the same set of frequency search points as would be used for a linear sweep, but the order of the search frequencies is changed to take advantage of the expected location.

The progression of frequencies in a spiral search can be explained as both a recursive and iterative algorithm. If the search index starts at k=1 and f(0) is defined to be the expected transition frequency, then search frequencies can be expressed as $f(k)=f(k-1)+(k-1)(-1)^k \Delta f$, where $\Delta f$ is the smallest step size. This recursive equation provides a simple expression for determining the frequency search points in a spiral algorithm. Alternatively:

$$f(k) = \hat{v}_* + \frac{\Delta f}{4}[(2k-1)(-1)^k + 1] \quad (9)$$

the first term being the expected transition frequency.

FIG. 3 shows an implementation of this algorithm. The x-axis shows the frequency offset from the expected transition location, and so the center of the plot represents the value of the expected location. The curve shows that the actual absorption signal is centered 15 kHz above the expected value. This offset is included to simulate an error in the chemical analog estimation of the transition frequency. The search points may be generated by calculating the intersection of a spiral with the search frequency axis. The search frequency in the spiral algorithm begins at this expected value and spirals outward until there is a change in absorption signal, which in the illustrated example occurs at an offset of 13 kHz.

A spiral search may be used as the first stage of the two stage search strategy, and terminating when an absorption signal is found having a magnitude greater than a threshold, such as the noise floor. If an absorption above threshold is never found, then the spiral algorithm terminates when all N frequency points have been searched.

Spiral Search Compared with Linear Sweep

Figure 4A:
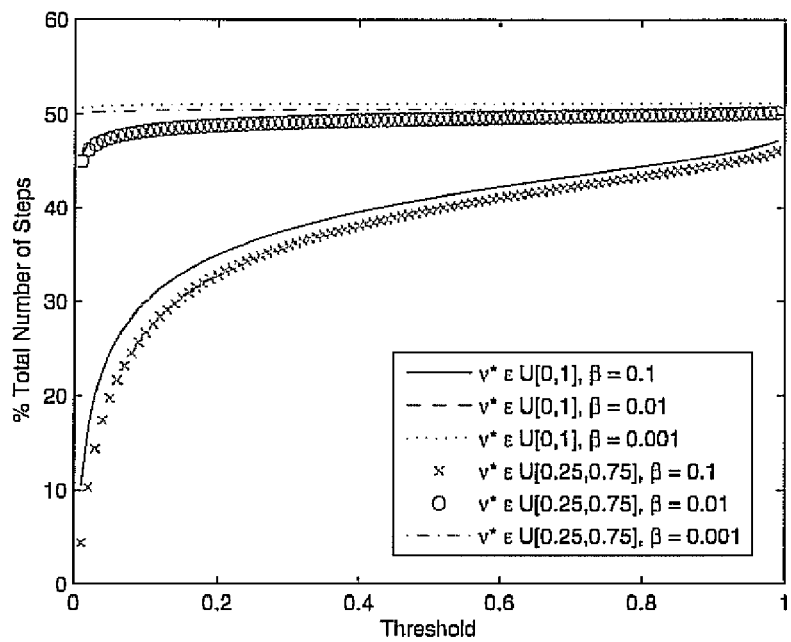
FIGS. 4A-4B show simulated results for linear sweep and spiral search respectively, with no noise component.
Figure 4B:
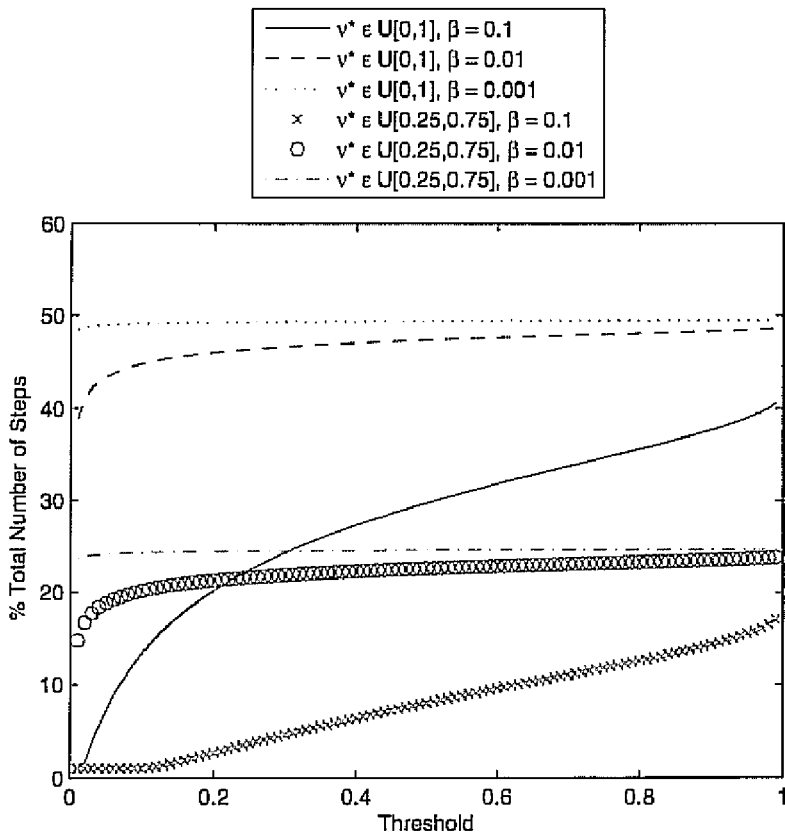

FIGS. 4A-4B show simulated results for linear sweep and spiral search, respectively, with no noise. These figures show the percentage of search points (k/N) necessary to find the transition versus threshold used ($\beta$). The conventional linear sweep begins at the smallest frequency in the search range and increments the frequency by a fixed step size $\Delta f$. In contrast, the spiral search begins at the expected location of the transition frequency and spirals outward from this point.

The search requires more steps to complete for larger values of the threshold and the peak separation. The spiral search algorithm shows a significant improvement in the percentage of steps when the distribution of transition frequencies is narrowed. The percentage of the total number of steps is approximately halved when the transition frequency is bounded by the uniform distribution between 0.25 and 0.75. This occurs because the potential location of the transition frequency is narrowed around the expected location of the transition frequency, effectively decreasing the required number of search points by a factor of 2.

The number of search points in the linear sweep algorithm is fixed to N, and the performance metric is the expected number of search points k that the spiral algorithm requires to detect an absorption signal with a magnitude above a fixed threshold value. In further simulations, the threshold level is varied and the transition frequency chosen from one of two uniform distributions.

The spiral search outperformed the linear sweep for all values of threshold, $\beta$, and expected frequency. For the uniform distribution from 0 to 1, the spiral search performs slightly better than the linear sweep. This occurs because the spiral search moves out from the middle of the range in both directions, and so it is able to quickly detect points on either side of the expected location. For narrowed distributions, the improvement is even more pronounced; the spiral algorithm decreases the number of search points by more than a factor of 2 because it searches around the expected location of the transition frequency.

Figure 5A:
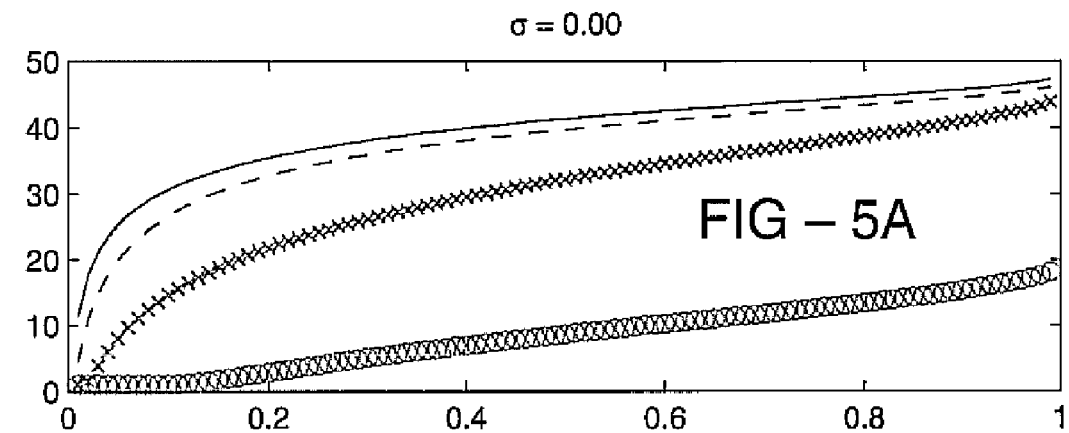
FIGS. 5A-5C show a comparison of linear and spiral searches for three different values of noise standard deviation.
Figure 5B:
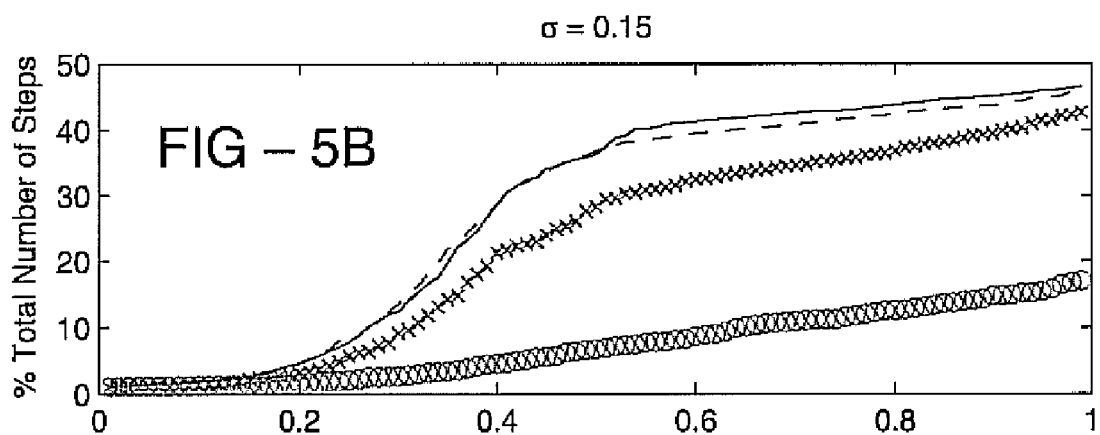
Figure 5C:
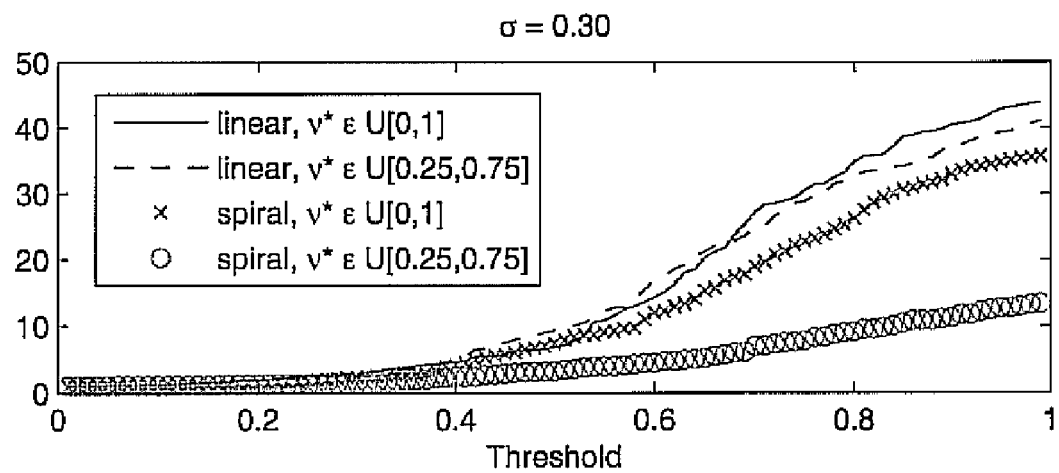

FIGS. 5A-5C shows a comparison of linear and spiral searches for three different values of noise standard deviation $\sigma$, with $\beta=1$. As the measurement noise increases, the percentage of search points falls to zero for low threshold values. Large measurement noise causes spikes in the absorption signal that may exceed the threshold, which resulting in a false detection.

To reduce false detections, the threshold value may be set at some multiple of the noise standard deviation, such as at least twice, more particularly above three times, for example between 3 and 4 times the noise standard deviation. The threshold was set at 3.3$\sigma$ for further simulations. A second, fixed threshold was also included, in cases where the noise value is low. The search is terminated when the signal equals or exceeds a first threshold related to noise level, while also exceeding a second fixed threshold. The second fixed threshold is readily selected to reduce false alerts while not greatly increasing detection time.

Data-Dependent Search Algorithm

A data-dependent algorithm chooses the next search frequency based on the absorption measurements at one or more previous search frequencies. Since the next frequency depends on feedback from the output, data-dependent searches are closed-loop algorithms. The algorithm described in this section may be used as the second stage of the two stage search strategy. The search begins at the last frequency point of the first stage of the search, and so it lies somewhere along the QR transition. Using extremum seeking adaptive control techniques, the data-dependent algorithm locates the two peaks of the absorption signal, which can then be used to find the transition location and width.

An extremum seeking adaptive control algorithm may be used to locate the frequencies of the peaks of the absorption signal. The algorithm begins at the last frequency point of the first stage of the two stage search strategy, and so the first frequency f(1) is located somewhere along the QR transition. The value of the absorption signal at this frequency is denoted A(1)=A(f(1)). The oscillator operating frequency is moved arbitrarily in one direction by an initial step size $\Delta f$. The absorption signal is then measured at the new frequency f(2) as A(2)=A(f(2)). The slope of the curve between f(1) and f(2) can then be used to determine which direction the search frequency moves to locate an extremum. Since the absorption signal varies because of noise in practical measurements, a sign-sign algorithm is used so that only the sign of the gradient influences the location of the next search point. For a sign-sign algorithm, the sign of the gradient is given by $$\frac{dL}{df}(2) = \frac{\text{sign}(A(2) - A(1))}{\text{sign}(f(2) - f(1))} \qquad (10)$$

The next search point f(3) is then determined based on the sign of the current absorption signal A(2) and the sign of the gradient.

$$f(3) = f(2) + \Delta f \frac{dL}{df}(2)\text{sign}(A(2)) \qquad (11)$$

or more generally $$f(k+1) = f(k) + \Delta f \frac{dL}{df}(k)\text{sign}(A(k)) \qquad (12)$$

where the sign of the gradient is given by $$\frac{dL}{df}(k) = \frac{\text{sign}(A(k) - A(k-1))}{\text{sign}(f(k) - f(k-1))} \qquad (13)$$

In this example, the sign of the current absorption signal A(k) is included in the frequency point calculation to enable searching for both positive and negative extrema. Since the absorption signal is centered on the y-axis, the sign of the absorption indicates if the current point is located near the maximum or the minimum. As a result, the adaptive control algorithm moves the search frequency in the direction of the extremum that is closest to the current frequency. That is, if the current absorption signal is positive, then the following search points will continue to move up the curve. Conversely, if the current absorption is negative, then the current search point is located near a minimum, and the next point moves further down the curve.

The step size may be constant, reduced after a certain number of iterations have occurred, or otherwise adjusted. However, it is possible that the extrema will not be found within the iteration limit, which results in a missed detection. Furthermore, if the peak of the transition is quickly located, then the algorithm may unnecessarily progress until the iteration limit is reach.

In some examples, the frequency step size is only reduced when a change in the sign of the gradient occurs, indicating that the search frequency has moved to the opposite side of an extremum. For example, the frequency step may be reduced (for example, halved) after moving through an extremum, and may be successively reduced (for example, halved) each time the extremum is passed through. In some examples, the search stops when (or soon after) the frequency step falls below a minimum threshold step value, for example after the extremum has been passed through a predetermined number of times.

An extremum seeking algorithm can be used to find both positive and negative extrema (in the case where the differential signal is detected), and the same algorithm used to find the first extremum can be used to find the second extremum, as long as the starting frequency is in the vicinity of the second peak. The two extrema are separated by a parameter β, which may be obtained from chemical analogs with known transition widths. The starting frequency for a second extremum search may then be selected as $f_{start}=f_1 \pm \beta$. If the direction (up or down in frequency) is not known, both may be investigated.

The inverse-lineshape parameter $T_2^*$ may be determined from the two extrema frequencies as:

$$T_2^* = \frac{\sqrt{3}}{3\pi(f_2 - f_1)} \quad (14)$$

Figure 6:
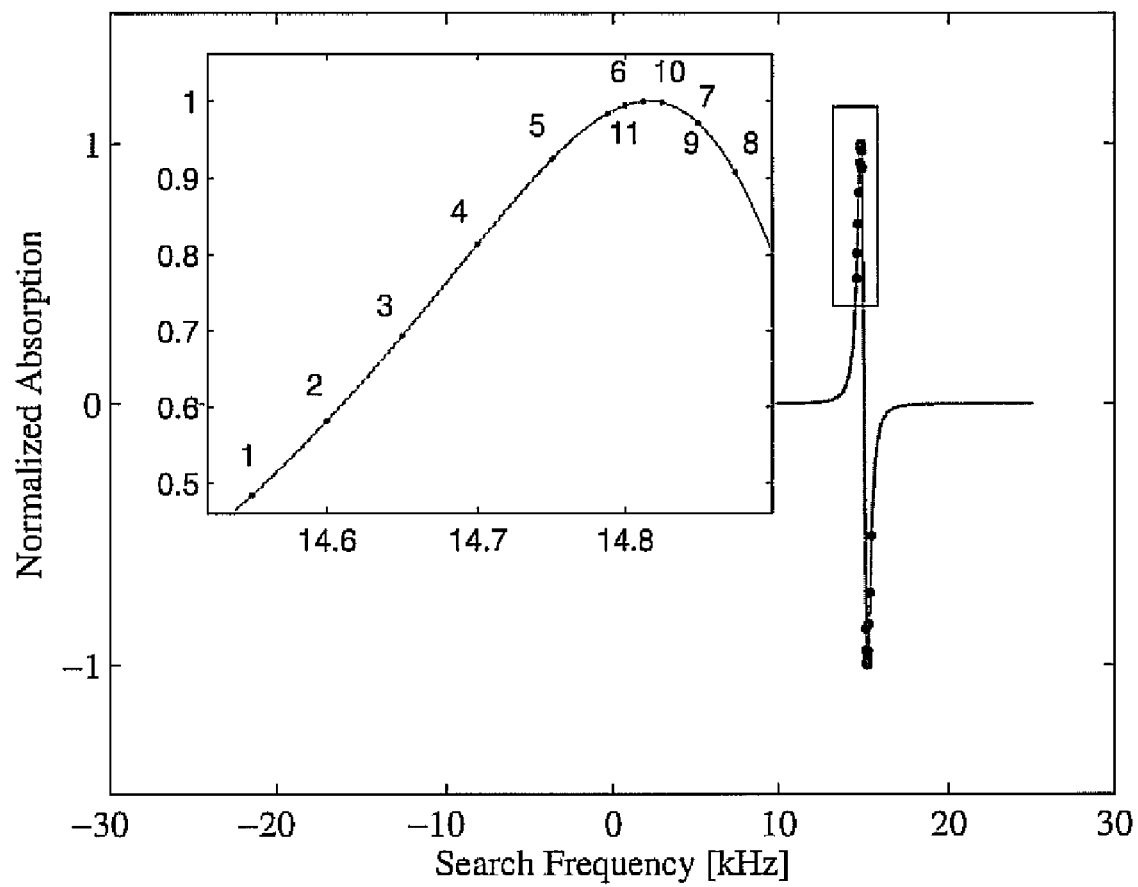
FIG. 6 illustrates operation of an extremum-seeking adaptive control algorithm.

FIG. 6 illustrates operation of an extremum-seeking adaptive control algorithm. Once the first extremum is found, the search frequency jumps the expected distance between the peaks to find the second extremum. The simulation for FIG. 6 includes an error between the expected and actual linewidths so that the second extremum seeking algorithm searches down the curve to find the minimum. For standard deviation of noise s=0.15 and 0.3, the algorithm did not find the extrema.

Modified Data-Dependent Search Algorithm

A data dependent search algorithm such as described above may be modified to reduce the effect of noise peaks.

In one approach, the algorithm can only reverse direction if the absorption changes by more than a preset noise threshold level. This preset threshold is set to some multiple of the noise standard deviation (such as at least twice, for example between 2σ and 3σ) so that spurious noise variations are less likely to trigger a change in the sign of the gradient.

If the frequency is incremented by the frequency step size and the observed change in the absorption signal is less than the preset noise threshold, then the frequency is again incremented and the difference in the absorption signal is measured between the new frequency and the original search point. If this difference exceeds the preset noise threshold, then the gradient is measured between these two frequencies; otherwise, the process is repeated and the absorption signal and gradient are measured at frequencies three times the frequency step apart.

In this example, the algorithm does not terminate using the step size bisection method. Therefore, it is only necessary to sweep the frequency through the extremum one time. This modification can be implemented by stopping the extremum seeking search when the sign of the gradient changes for the first time. Allowing the frequency to oscillate back and forth can increase the accuracy of the average estimation, but also increases the time to detection. Restricting the frequency search to one pass through the transition makes the start point of the extremum seeking algorithm nontrivial. Since the search cannot return to measure any missed values, the start frequency is preferably on the side of the transition that is closest to the expected transition frequency. The start point may be moved back from the end of the spiral search towards the location of the expected transition. For example, if the transition lies to the right (higher frequency) of the expected transition location, then at the end of the spiral search, the search frequency would be decremented by $3\Delta f$ to help ensure that the extremum seeking algorithm does not miss part of the peak.

Once the sign of the gradient changes, the modified extremum seeking adaptive control algorithm terminates. Unlike the original data-dependent algorithm, the estimated value of the transition frequency is not equal to the frequency of the last search point. The modified search algorithm takes a weighted average of any frequencies with absorption signals that are less than the noise threshold away from the peak value of the search. The estimated peak location can then calculated as the centroid $$f_1 = \frac{\sum_{n=1}^{k} A(f(n))f(n)}{\sum_{n=1}^{k} A(f(n))} \quad (15)$$

Figure 7A:
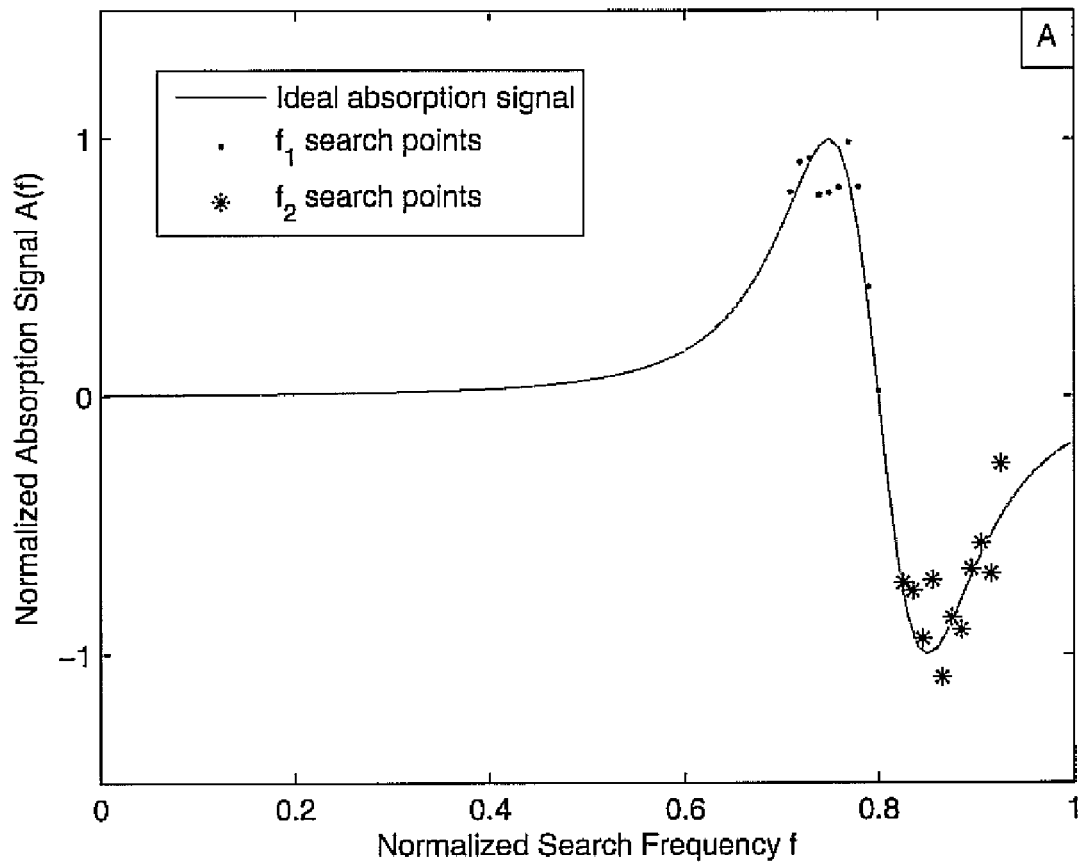
FIGS. 7A-7C show the operation of a modified data-dependent algorithm with a typical noise standard deviation $\sigma=0.15$.
Figure 7B:
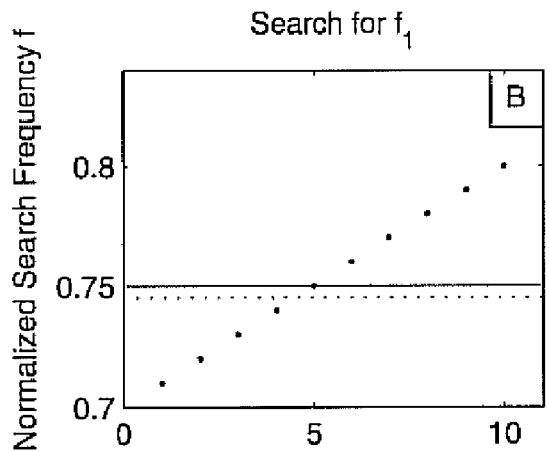
Figure 7C:
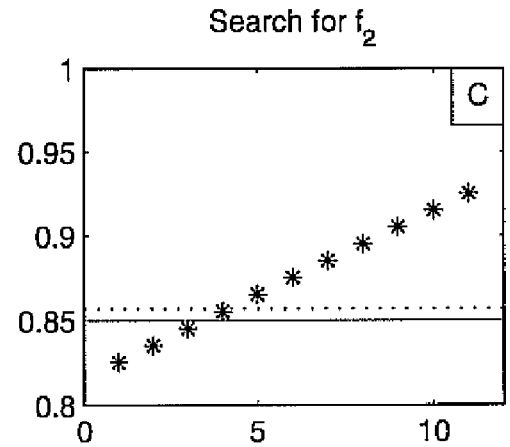

FIGS. 7A-7C show the operation of a modified data-dependent algorithm with a typical noise standard deviation σ=0.15. The first search frequency starts to the left (lower frequencies) of the end of spiral search and so it lies on the left side of the maximum, as shown in FIG. 7A.

FIG. 7B shows the progression of search frequencies across the maximum, which is depicted as a solid line. The search frequency passes through the extremum once, and when the gradient changes sign, the extremum seeking algorithm terminates. The algorithm then performs the weighted average to calculate the estimated peak location, which is shown as a dotted line in Plot B.

FIG. 7C shows the frequency search for the second extremum.

Extremum Detection Using Blind Search

In further examples, a blind search, such as a linear blind search, may be used for extremum detection once the general vicinity of a transition has been located.

In an example of two-stage search, after the completion of the spiral search, the search frequency is swept linearly through the transition. The linear sweep terminates once the absorption signal measurements average to zero to ensure that points after the QR transition are not measured. Once the linear sweep completes, a weighted average is used to estimate the frequency locations of the extrema. This two-stage search algorithm is a blind-blind algorithm because it uses a blind spiral search for the first stage and a blind linear search for the second stage. However, this algorithm does use absorption signal measurements to determine when to terminate, and so it has some data-dependence. The linear search stops when the average of all of the measured absorption signals falls below some fraction, such as 10%, of the height of the signal. This approach helps ensure that there are an equal number of search points on either side of the two extrema.

In cases of low noise, it is possible that the average of the first few search points will be small enough to end the search prematurely. On the other hand, in cases of high noise, it is possible that the average will never be small enough to stop the search. To help prevent these two cases, an example linear sweep may search at least twice, but no more than four times the expected peak separation. If the average falls to zero at any point within this range, or if the search frequency reaches $3\beta$, then the linear sweep may terminate.

A linear search is preferably started on the nearest side of the transition so that the entire absorption signal is mapped out. The technique of moving backwards 3 step sizes from the spiral endpoint is used in this algorithm to set the starting point for the linear sweep. By starting the sweep on the side of the transition closest to the expected value, the linear sweep generally starts and ends just outside of the locations of the two extrema.

Upon completion of the linear frequency search, a blind-blind algorithm may use a weighted average to estimate the locations of the peaks. The averaging method from the previously discussed modified algorithm, described above, can also used for this algorithm. However, for the blind-blind algorithm there is only one set of search frequencies, and this set contains both the maximum and the minimum. Therefore, the maximum may be estimated by averaging the frequencies that produce the largest absorption signals, while the minimum uses the frequencies with the smallest responses. Search frequencies are selected for the averages if their absorption signals lie less than the preset noise threshold away from the maximum or minimum value.

Figure 8A:
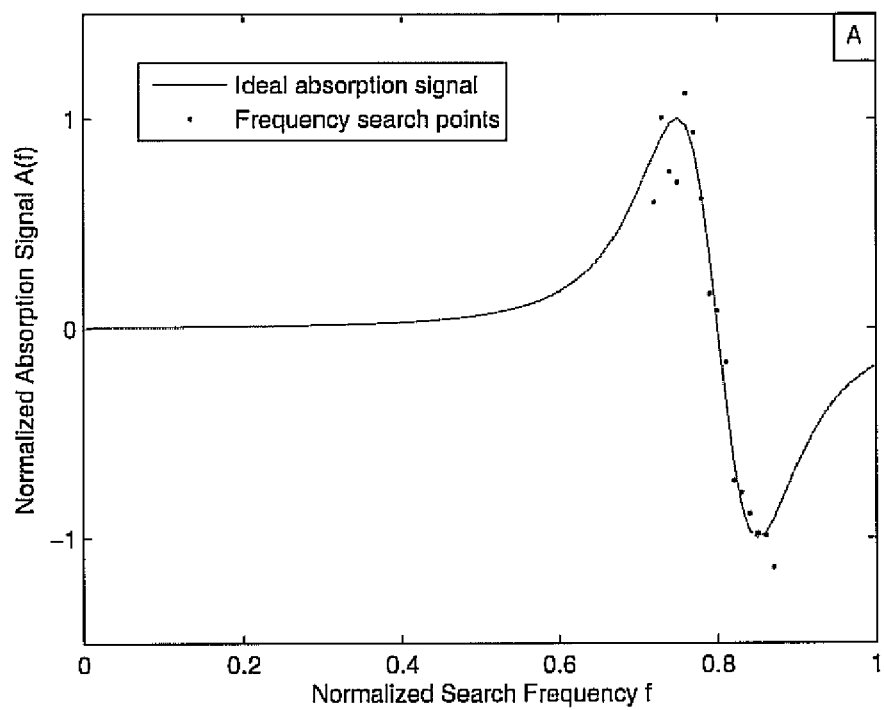
FIGS. 8A-8B illustrate a search using the two stage blind-blind algorithm.
Figure 8B:
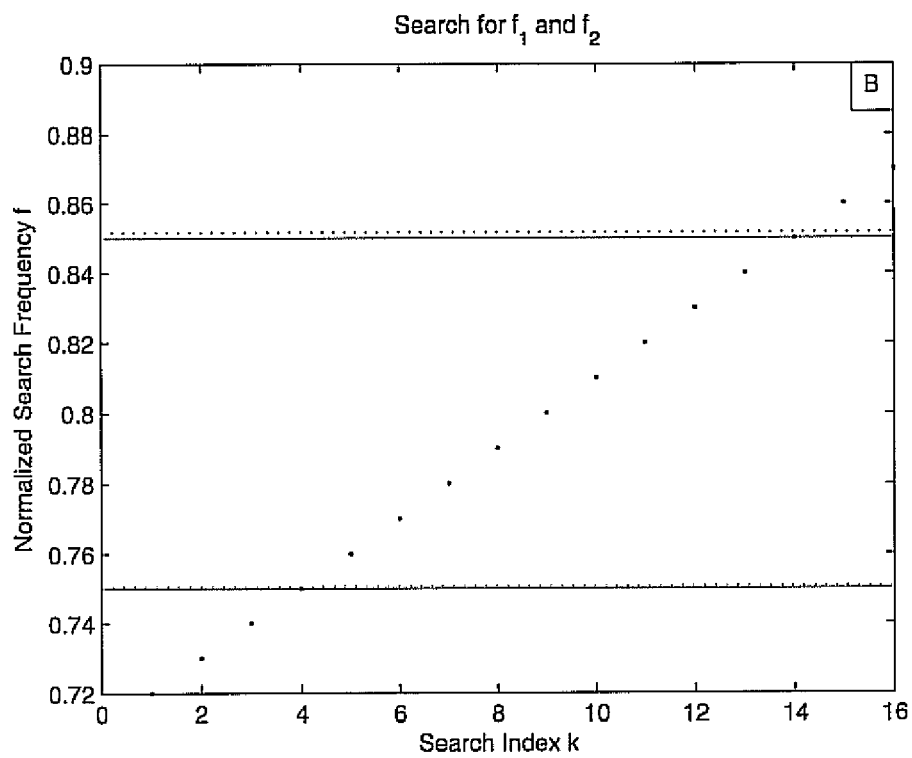

FIGS. 8A-8B illustrate a search using the two stage blind-blind algorithm. FIG. 8A shows the search frequencies used by the second stage linear sweep with a typical standard deviation of measurement noise, $\sigma=0.15$. FIG. 5B shows the search frequency progression for each iteration of the algorithm. The solid lines in FIG. 5B represent the true values of the peak location, while the dotted lines are the estimated frequencies. As shown, the search frequency begins on the left side of the transition and is incremented by the same step size until it passes through both peaks of the absorption signal. The weighted average is able to estimate the locations of the extrema with a high degree of accuracy because it counteracts the effect of measurement noise.

The performance of various search algorithms were evaluated using the expected time to detection and the percent errors in the transition frequency and linewidth estimations. The approaches compared included a conventional linear sweep algorithm and three two-stage search strategies: a blind spiral with a data-dependent search algorithm; a blind spiral with a modified data-dependent search algorithm to reduce noise effects; and a blind spiral with a blind linear extremum search.

FIGS. 9A-9C shows the performance comparison for low noise values when the absorption curve has a peak separation. FIG. 9A shows the percent error in the estimation of the location of the transition frequency. FIG. 9B shows the percent error in the estimation of the peak separation. For the conventional linear sweep, the transition frequency is calculated as the mean of the frequencies that produce the maximum and minimum absorption signal measurements. The conventional linear sweep has the smallest estimation error because it measures the absorption signal at every point in the search range. The estimation error of the (unmodified) two stage search strategy becomes relatively large in the presence of measurement noise. FIG. 9C shows the expected time to detection for the algorithms.

FIGS. 10A-10C show performance metrics over a larger range of standard deviation values. The estimation error and time to detection of the conventional sweep remain constant over the entire range. In the presence of high measurement noise, the errors in all of the other algorithms increase. Once the noise standard deviation is larger than 0.2, the modified algorithms have approximately the same amount of error in the transition frequency estimation. FIG. 10A shows the estimation error in the peak separation remains relatively low for the original two-stage and modified data-dependent algorithms. This occurs because these algorithms use an expected linewidth to jump to the next peak. In contrast, the peak separation error in the blind-blind algorithm increases dramatically because the spiral search is unable to discriminate any point on the transition, and there is no expected linewidth to fall back on.

FIG. 10C (also FIG. 9C) compare the expected time to detection of the four search algorithms. As expected, the conventional search has the largest expected time to detection of 17 minutes. This time does not vary with the standard deviation because the conventional sweep always uses the same number of search points. The other three algorithms all take less than 5 minutes, and so they improve the detection time by a factor of 3.

Figure 11:
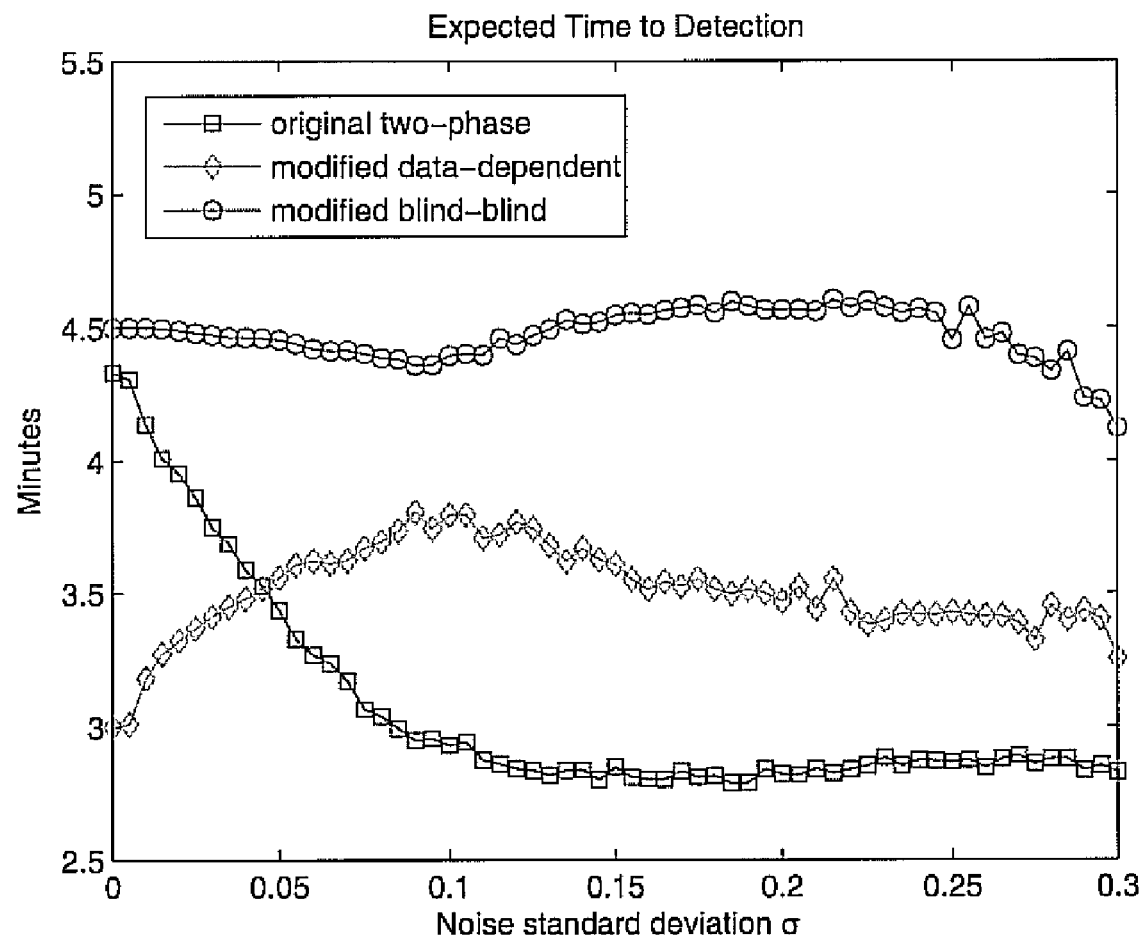
FIG. 11 shows the expected time to detection for three algorithms.
Figure 13A:
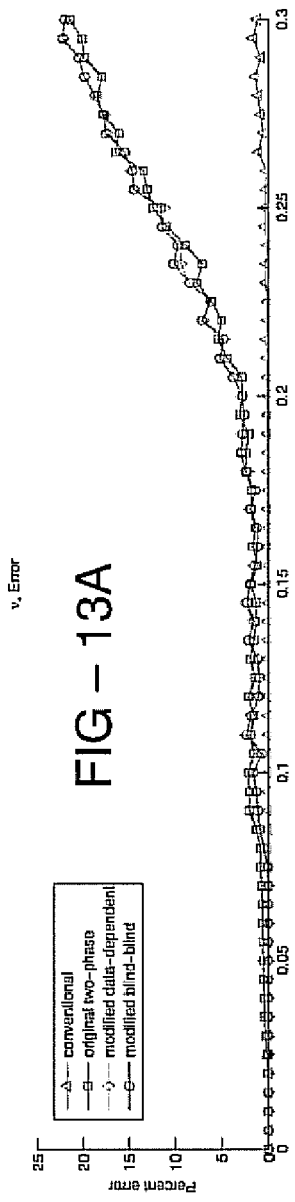
FIGS. 13A-13C show frequency error, expected time to detection, and noise standard deviation for different algorithms.
Figure 13B:
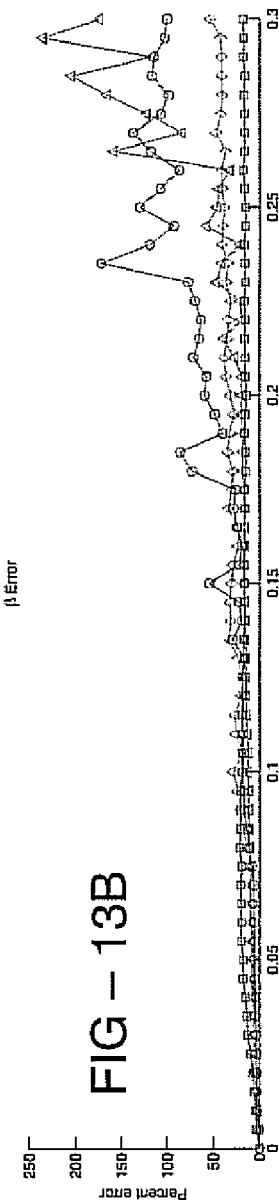
Figure 13C:
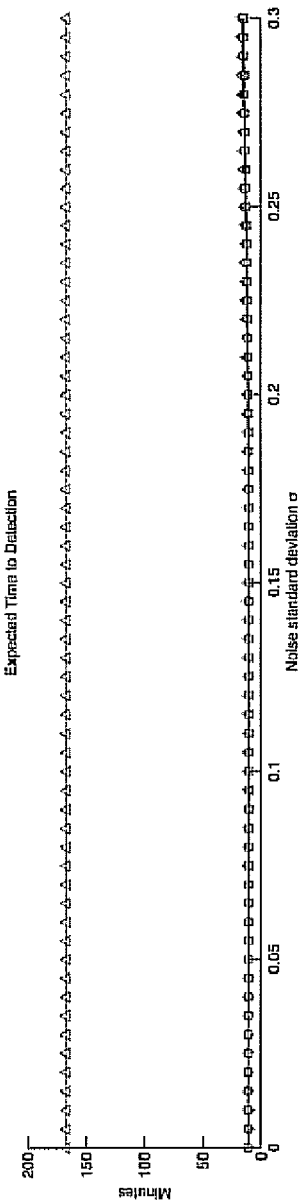
Figure 14:
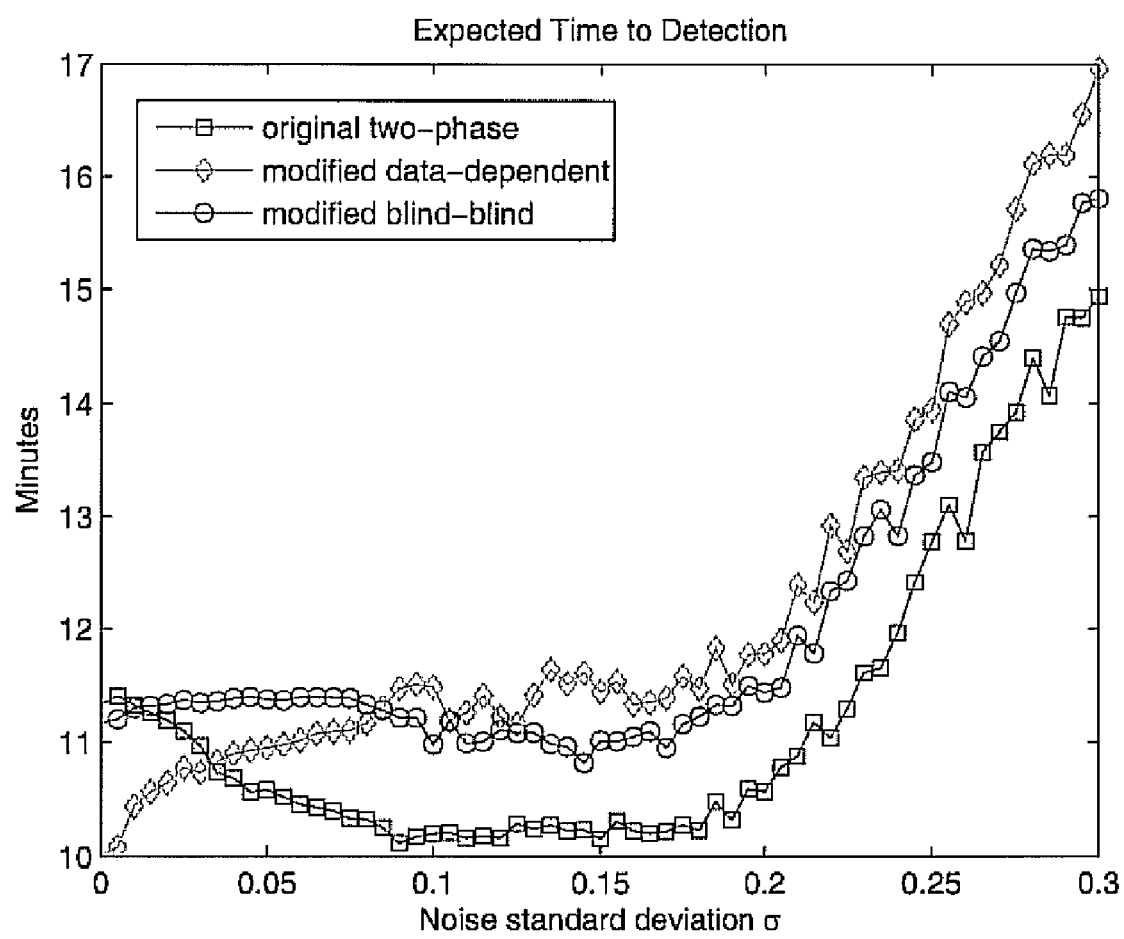
FIG. 14 shows expected time to detection for various algorithms.

FIG. 11 shows the expected time to detection for three novel algorithms, since the long detection time of the conventional sweep compresses the scale of the plots in FIGS. 9 and 10. The unmodified two-stage search algorithm is the fastest algorithm over most of the search range. For very low standard deviations of measurement noise, the modified data-dependent algorithm has a smaller expected time to detection. The blind-blind algorithm has a relatively constant expected time to detection of 4.5 minutes.

FIGS. 12A-12C, 13A-13C, and FIG. 14 are analogous to FIGS. 9A-9C, 10A-10C and FIG. 11 (respectively), and show the same set of simulation results for an absorption signal with peak separation $\beta=0.01$ (on a normalized frequency scale). These results show the similar trends to those discussed above. At low noise values, the modified algorithms perform better than the original two-stage strategy. At higher standard deviations of measurement noise, and the search performance is comparable. A difference between the two sets of simulations is shown in the expected time to detection. When the width of the transition is a smaller percentage of the total search range, the factor of improvement in the expected time to detection is larger. In this example, the conventional search always takes 167 minutes to complete. In contrast, the novel algorithms developed here take less than 12 minutes in the presence of typical measurement noise. Hence, these algorithms improve the expected time to detection by more than an order of magnitude.

The percent errors presented here apply only to the normalized frequency search range where the search frequency is normalized between 0 and 1. The real percentage error (PE) is found from the normalized error ($PE_{norm}$) using:

$$PE = PE_{norm} F_s \frac{v_{*norm}}{v_*} \quad (16)$$

For example, for HMT at 295 K, the transition frequency is 3.6 MHz. A typical search range FS is ±50 kHz to either side of the expected location, or 100 kHz total. The normalized percent error $PE_{norm}$ is approximately 1%. The normalized transition frequency for these simulations is 0.8. Applying the percent error transform from the equation above an actual frequency error of 0.0222%, or ±800 Hz.

Optimal selection of algorithm parameters such as frequency step based on observed measurement noise may further improve the expected time to detection and estimation errors of the search algorithms.

A curve fitting algorithm may be used to estimate the transition location and linewidth. If the shape of the QR transition is assumed to be Lorentzian, then post processing can be used to find a least squares fit of the measured absorption signal values. The exact lineshape may be unknown, for example due to temperature variations and/or strain gradients across a sample. However, other lineshape models may be fitted.

Further Discussion of Lock-In Detection

The lock-in amplifier's time constant places an upper limit on the frequency sweep rate, and for a simple frequency sweep the overall search time is the product of the tuning rate and the sweep range of the search. A typical linear sweep search may take hours to complete. However, a CW spectrometer can be electronically tuned, using for example switched capacitors in a resonant circuit including the probe coil, or a resonant circuit inductively coupled to the probe coil. Hence, direct tuning to any desired frequency is possible.

HTS Resonators

In some examples, spectrometers may use high temperature superconductor (HTS) resonators. Example resonators were fabricated on 0.5 mm thick, 50 mm diameter lanthanum aluminate wafer coated on both sides by a film of the thallium-based HTS material $Tl_2Ba_2CaCu_2O_8$ (TBCCO). Films were formed using a sputter deposition of an amorphous precursor film, which does not contain thallium, on the front and back surfaces of the wafer. A subsequent high temperature anneal in a thallium oxide partial pressure forms the epitaxial superconducting stage. The resulting 0.6 micrometer TBCCO films have a critical temperature above 102 K and a surface resistance of 300 microohms measured at 10 GHz. The resonators have a generally spiral form between inner and outer circular sections.

Coarse tuning of an HTS resonator may be mechanically based, for example through electrical coupling a HTS resonator to a low-loss dielectric wafer, and/or coupling to a second resonator (conventional resonator or HTS resonator). Varying the proximity of a dielectric wafer to a HTS resonator produces a net change in the self-capacitance of the HTS resonator, thereby effecting a change in resonant frequency. Electrical coupling between two HTS resonators results in two resonant peaks whose locations are varied by adjusting the mechanical displacement between the two resonators. Capacitors allow distributed capacitive coupling between the turns of a single coil.

Fine tuning of an HTS resonator can be accomplished by magnetically coupling the HTS resonator to a second resonant circuit formed by a loop surrounding the resonator, called a control loop, and an external capacitance. The control loop may be non-superconducting metal (such as copper), or a superconducting metal loop which will avoid lowering the Q-factor of the transmitter. Varying the external capacitance can electrically control the frequency of the HTS probe. The circuit's resonant frequency is determined by its inductance and capacitance. Thus, tuning the circuit's resonant frequency is accomplished by changing either the inductance and/or capacitance. For the HTS resonator, this corresponds to changing the amount of energy stored by the resonator in either its magnetic field and/or its electric field.

In some examples, coarse tuning may use a spiral search algorithm, with fine tuning used for extremum detection.

Coarse frequency adjustments, such as those based on mechanical displacement of the resonator, may be used to select a scanned range, and fine adjustments (such as electrically-controlled adjustments, including those based on switched capacitors in a coupled resonant circuit, or coupling currents) may be used to scan through a desired frequency range.

The scan speed may be adjustable, for example to account for the expected quantity of analyte. A scan may be repeated at a slower scan speed if desired.

The scan speed may be substantially constant during a scan, or the scan speed may be variable, for example being slower in regions of particular interest. The scan speed may be reduced if a signal (an apparent QR response) is detected. The frequency may be scanned rapidly to locate possible peaks, with slower scans through identified candidate peaks. An adaptive algorithm, such as a fuzzy logic algorithm, may be used to determine the scan speed, and/or frequency steps used. The frequency may be changed continuously, for example using an analog controller, or may be stepped through a desired frequency range. The frequency steps may be regular and sequential, or may move through the frequency scan range using an adaptive algorithm to more quickly locate analyte response peaks.

Lineshapes may be determined from detected signals, and used to separate noise peaks from NQR signal peaks. For example, a noise peak may be narrower than the expected range of QR signal linewidth, and this determination used to eliminate noise peaks. Expected line positions and linewidths may be stored in a memory, such as a look-up table, as a function of analyte temperature, and used to facilitate analyte detection.

In some examples, the same HTS resonator is used for detection and excitation. However, in other examples, a conventional coil is used for continuous excitation, and an HTS resonator is used for detection. This allows the HTS resonator to be optimized for detection. In other examples, separate HTS coils are used for excitation and detection.

In some examples, an apparatus is provided that performs both pulsed and continuous (CW) NQR detection, depending on user input and/or data collected, and which may switch from one mode of operation to another according to determined analyte relaxation times. Pulsed detection may be relatively less effective for long analyte relaxation times, and in such cases a CW detection mode may be selected.

In some examples, the Q-factor of an HTS resonator may be higher than necessary, and circuitry provided to reduce the Q-factor of the HTS resonator. This may be useful for changing the scanning speed, for example for use in a preliminary scan or first stage algorithm. For example, additional resistance or coupling coils may be provided to allow the Q-factor to be variable. A HTS resonator may be magnetically coupled to a second resonant circuit, and if the second resonant circuit is lossy, the Q-factor of the HTS resonator is reduced. The maximum Q-factor may be the intrinsic Q-factor of the HTS resonator, for example 20,000 or greater; but using additional circuitry, such as a magnetically coupled lossy resonant circuit, this value may be reduced to any desired value.

A method of locating a nuclear quadrupole resonance for an analyte within a sample volume, the analyte having an expected transition frequency, comprises exciting the sample with an excitation magnetic field, the excitation magnetic field having an excitation frequency, selecting a starting excitation frequency approximately equal to the expected transition frequency, adjusting the excitation frequency using a first search algorithm so as to detect a resonance absorption, and adjusting the excitation frequency search algorithm using a second search algorithm so as to determine a quadrupolar resonance frequency. The first search algorithm may be a blind search algorithm, such as a blind spiral search algorithm. The second search algorithm may be an extremum seeking algorithm, such as a data dependent algorithm in which search frequencies are determined at least in part using collected data. The expected transition frequency may be determined using chemical analog analysis and ambient conditions such as temperature.

Applications

Applications of the present invention include contraband detection, nondestruction evaluation (NDE) of materials, imaging, and characterization of polymorphism.

Example applications of apparatus and methods described herein include identification of polymorphs of pharmaceutical compounds and other materials, non-destructive process control for chemical synthesis (for example, pharmaceutical preparation, organic synthesis, plastics synthesis, and the like). Polymorph discrimination can also be used in improved methods of manufacturing agrochemicals, pigments, dyes, foods, explosives, and the like.

Further Discussion of CW Spectroscopy

Examples of the present invention include apparatus and methods for reducing the time required to detect and characterize quadrupole resonance (QR) transitions using continuous-wave (CW) spectroscopy. In comparison to conventional CW spectroscopy, examples of the present invention reduces the time required to search for, verify the presence of, and quantify the properties of a QR transition by providing a method for systematically varying the amplitude and frequency of the CW excitation signal over orders of magnitude while simultaneously reducing the number search steps in which the frequency and amplitude of the detection system are varied.

QR spectrometers may use pulsed and/or CW excitation. In either case, a probe coil inductively couples to the magnetic moment of quadrupolar nuclei within the material. In pulsed spectroscopy, the coil broadcasts short duration radio frequency (RF) pulses and, if a target compound is present, recovers a transient RF magnetic field response from the quadrupolar nuclei during the interval between the applied pulses. In CW spectroscopy, a probe coil may form a tuned circuit in a CW oscillator, and as the oscillator frequency (referred to elsewhere as the search frequency) sweeps across a QR transition, absorption of energy by the quadrupolar nuclei produces a dip in the oscillator amplitude. CW and pulsed spectrometers yield the same information in that the Fourier transform of the pulsed spectrometer response is identical to the absorption spectra obtained from the CW spectrometer. Pulsed spectrometers provide a greater signal-to-noise ratio (SNR) per unit time because the Fourier spectra of the excitation pulse excites the entire QR transition within the short duration of a RF pulse. Pulse spectrometers are inherently more expensive to construct and maintain as they require RF pulses whose magnetic field strength is orders of magnitude larger than the amplitude of the substantially monochromatic RF source used in CW spectrometers.

In contrast, conventional CW spectrometers sweep the frequency of a nearly monochromatic excitation source across the QR transition, thereby increasing the time required to characterize the QR transition by a factor approximately equal to the square root of the ratio of the QR transition linewidth to the sweep range of the CW spectrometer. Embodiments of the present invention include apparatus and methods (such as algorithms) for reducing the time required for a CW NQR spectrometer to detect a resonance. The combination of a low cost CW spectrometer with an algorithm for minimizing detection and characterization time provides an instrument that may enhance commercial applications of QR technology.

Examples of the present invention include CW-NQR apparatus including a marginal oscillator, for example the Robinson marginal oscillator. Here, the term "marginal" means that regardless of the voltage cross the probe coil, the CW oscillation is sustained by feeding back a fixed signal level to the tuned circuit containing the probe coil.

A CW spectrometer comprising a marginal oscillator allows the user to control the amplitude of the oscillation and adjust the frequency of the oscillation within a spectral region believed to contain a transition. The amplitude of the oscillation affects the magnitude of the absorption signal, and hence the SNR of the CW spectrometer measurement. There exists an optimal value for the oscillator amplitude, but this value is a function of two relaxation time constants whose values are typically unknown when identifying QR transitions in a material for the first time.

Conventionally, the frequency of a CW spectrometer has been traditionally swept across a spectral region of interest by using a clock motor mechanically coupled to an air-variable capacitor through a gear reduction system. This is a linear search, in which the frequency depends on time in a linear manner. The inductance of the probe coil and the value of the variable capacitance determine the frequency of the CW excitation, while the gear reduction rate sets the sweep rate, and hence detection time, of the CW spectrometer. However, this approach is very time consuming.

In conventional CW QR spectrometers, it is often difficult to vary the amplitude of the CW oscillator over a sufficiently wide range to account for the broad range of relaxation times that determine the optimal excitation level. Marginal oscillator designs use a limiter in the feedback path to set the level of oscillation, but our analysis shows that there is a lower limit on the amplitude of oscillation that this technique can provide.

The optimal oscillation amplitude is inversely proportional to the square root of the product of the unknown relaxation times, so that materials with large relaxation times are difficult, if not impossible, to detect. In embodiments of the present invention, user controls are provided that allow variation of the oscillation amplitude over a wide dynamic range. In examples of the present invention, determination of relaxation times can be used to adjust the oscillation amplitude for future operation. This adjustment may be done automatically, for example after determination of a value for $\beta$.

Conventional CW spectrometers generally force the user to accept a blind search policy for detecting QR transitions as the motor-driven capacitor systematically sweeps the oscillation frequency across a fixed spectral window. The conventional arrangement does allow the selection of non-contiguous frequencies for the purpose of reducing the time required to search for and quantify QR transitions.

In some examples of the present invention, the loop gain within a marginal oscillator is maintained at a minimum value in order for the network to sustain an oscillation. In order to vary the amplitude of the oscillation over a wide dynamic range, in addition to adjusting the limiter output, a variable gain amplifier is used in the feed-forward path of the network to maintain a minimal loop gain for sustaining oscillations.

HTS resonators and the use of switch capacitors for tuning, control circuitry, and signal analysis are further described in US2008/0129291 "Method for reducing the coupling during reception between excitation and receive coils of a nuclear quadrupole resonance detection system"; US2008/0036462 "Quadrupole resonance using narrowband probes and continuous wave excitation"; US2008/0018332 "Method and apparatus for detection of quadrupole nuclei in motion relative to the search region", and US2008/0001602 "Detecting quadrupole resonance signals using high temperature superconducting resonators", the contents of all of which are incorporated herein by reference. In particular, apparatus described in US2008/0036462 can be adapted for use with examples of the present invention.

In some examples of the present invention, the clock motor and air-variable capacitor tuning system of conventional systems is replaced with a capacitance (or other reactive element) whose value can be adjusted electrically, for example using digital signals applied over control lines for coarse adjustment (e.g. switching capacitors in and out of a resonant circuit), and using an analog electrical signal for fine adjustment. A digital signal can be used to select switchable capacitors to obtain a desired capacitance value. An analog signal can be used to vary the capacitance of a varactor, or other device having a voltage-adjustable capacitor.

Examples of the present invention include spectrometers including a digital computer, and the computer is used for regulating the oscillator frequency and amplitude so that the search and characterization of QR transitions cannot only be automated, but also optimized in real-time to achieve a reduction in the duration of the analysis.

The blind search approach generally employed in conventional CW spectrometers is time-inefficient, and the search time can be reduced using non-contiguous frequency and amplitude search points.

In some examples, a two-stage approach was used for detecting QR transitions. The first stage is a binary search for initial detection of an absorption signal. Detection of the absorption signal can automatically terminate the first stage, and initiate a second stage. In the second stage, an adaptive algorithm can be used to resolve the complete absorption curve. In some examples, both oscillator frequency and amplitude can be adjusted based on the observed absorption signals.

Apparatus and methods can be used with CW spectrometers using high temperature superconducting (HTS) resonators, allowing further improvements of SNR per unit time of absorption measurements. Examples of the present invention also include continuous wave spectrometers with HTS resonators, such as continuous wave NQR spectrometers operable to use oscillator frequency and amplitude search methods such as those described herein.

Patents, patent applications, or publications mentioned in this specification are incorporated herein by reference to the same extent as if each individual document was specifically and individually indicated to be incorporated by reference. The invention is not restricted to the illustrative examples described above.

Examples are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims. Having described our invention, we claim:

The invention claimed is:

1. A method of characterizing a nuclear quadrupole resonance for an analyte within a sample volume using continuous wave (CW) spectroscopy, the method being performed by a spectrometer, the method comprising:
    applying an excitation magnetic field to the sample volume, the excitation magnetic field having a search frequency;
    adjusting the search frequency using a blind search algorithm so as to detect a resonance absorption signal, the blind search having a start frequency and an end frequency; and
    adjusting the search frequency using an extremum seeking algorithm so as to determine an extremum in the resonance absorption signal,
    frequency steps between successive search frequencies increasing and alternating in sign during the blind search.

2. The method of claim 1, wherein the blind search includes selecting search frequencies alternating between frequency values higher than the start frequency and frequency values lower than the start frequency.

3. The method of claim 1, the blind search being a spiral search centered at the start frequency.

4. A method of characterizing a nuclear quadrupole resonance for an analyte within a sample volume using continuous wave (CW) spectroscopy, the method being performed by a spectrometer, the method comprising:
    applying an excitation magnetic field to the sample volume, the excitation magnetic field having a search frequency;
    adjusting the search frequency using a blind search algorithm so as to detect a resonance absorption signal, the blind search having a start frequency and an end frequency; and
    adjusting the search frequency using an extremum seeking algorithm so as to determine an extremum in the resonance absorption signal,
    wherein the extremum-seeking search is a data dependent search,
    the search frequencies used during the extremum-seeking search being selected at least in part using obtained magnitudes and signs of resonance absorption signals.

5. The method of claim 4, frequency steps used during the extremum-seeking search being selected using changes in detected absorption signal magnitude.

6. The method of claim 4, the extremum-seeking search using frequency steps having a frequency step magnitude that decreases during the extremum-seeking search.

7. A method of characterizing a nuclear quadrupole resonance for an analyte within a sample volume using continuous wave (CW) spectroscopy, the method being performed by a spectrometer, the method comprising:
    applying an excitation magnetic field to the sample volume, the excitation magnetic field having a search frequency;
    adjusting the search frequency using a blind search algorithm so as to detect a resonance absorption signal, the blind search having a start frequency and an end frequency; and adjusting the search frequency using an extremum seeking algorithm so as to determine an extremum in the resonance absorption signal, the start frequency being an expected transition frequency for the analyte, the extremum-seeking search starting at the end frequency of the blind search.

8. A method of characterizing a nuclear quadrupole resonance for an analyte within a sample volume using continuous wave (CW) spectroscopy, the method being performed by a spectrometer, the method comprising:

applying an excitation magnetic field to the sample volume, the excitation magnetic field having a search frequency;

adjusting the search frequency using a blind search algorithm so as to detect a resonance absorption signal, the blind search having a start frequency and an end frequency; and adjusting the search frequency using an extremum seeking algorithm so as to determine an extremum in the resonance absorption signal, wherein applying an excitation magnetic field is obtained using a marginal oscillator, the search frequency being the oscillation frequency of the marginal oscillator.

9. A continuous wave nuclear quadrupole resonance (NQR) spectrometer, the spectrometer comprising:

a probe coil;

an oscillator, the oscillator having an oscillation frequency, and an oscillation frequency controller, the oscillation frequency controller being operable to adjust the oscillation frequency, the oscillation frequency controller being operable to use a blind search to locate a quadrupole resonance signal, the oscillation frequency controller being further operable to use an extremum-seeking search to locate an extremum of the quadrupole resonance signal, the oscillator being a marginal oscillator comprising an amplifier and a limiter, the amplifier gain being adjustable so as to maintain oscillation of the marginal oscillator.

10. The spectrometer of claim 9, the blind search being a blind spiral search.

11. The spectrometer of claim 9, the extremum-seeking search using an adaptive search algorithm to locate the extremum.

12. The spectrometer of claim 9, the probe coil comprising a high temperature superconductor (HTS) resonator, the HTS resonator being superconducting during operation of the spectrometer.

13. The spectrometer of claim 12, the oscillator being magnetically coupled to the HTS resonator.

* * * * *